United States Patent
Wulff

(10) Patent No.: US 9,496,477 B2
(45) Date of Patent: Nov. 15, 2016

(54) METHOD FOR PRODUCING SUBSTRATES FOR SUPERCONDUCTING LAYERS

(71) Applicant: Danmarks Tekniske Universitet, Lyngby (DK)

(72) Inventor: Anders Christian Wulff, Smørum (DK)

(73) Assignee: Danmarks Tekniske Universitet, Lyngby (DK)

( * ) Notice: Subject to any disclaimer, the term of this patent is extended or adjusted under 35 U.S.C. 154(b) by 146 days.

(21) Appl. No.: 14/402,802

(22) PCT Filed: May 17, 2013

(86) PCT No.: PCT/DK2013/050148
§ 371 (c)(1),
(2) Date: Nov. 21, 2014

(87) PCT Pub. No.: WO2013/174380
PCT Pub. Date: Nov. 28, 2013

(65) Prior Publication Data
US 2015/0087524 A1 Mar. 26, 2015

(30) Foreign Application Priority Data
May 21, 2012 (EP) .................................... 12168636

(51) Int. Cl.
*H01L 39/14* (2006.01)
*H01L 39/24* (2006.01)
*H05K 1/09* (2006.01)

(52) U.S. Cl.
CPC ......... *H01L 39/2454* (2013.01); *H01L 39/143* (2013.01); *H01L 39/248* (2013.01); *H05K 1/092* (2013.01); *Y10T 29/49014* (2015.01)

(58) Field of Classification Search
CPC ............ H01L 39/2454; H01L 39/143; H01L 39/248; H05K 1/092
See application file for complete search history.

(56) References Cited

U.S. PATENT DOCUMENTS 3,837,907 A 9/1974 Berglund et al.
4,101,731 A * 7/1978 Marancik ............... H01L 39/14
174/125.1

(Continued)

FOREIGN PATENT DOCUMENTS

CN 1849715 10/2006
CN 101290905 10/2008

(Continued)

OTHER PUBLICATIONS

Sumption MD et al., "Ac loss in YBCO coated conductors exposed to external magnetic fields at 50-200 Hz", Physica C, No. 466, (2007), pp. 29-36.

(Continued)

*Primary Examiner* — Colleen Dunn
(74) *Attorney, Agent, or Firm* — McDermott Will & Emery LLP

(57) ABSTRACT

There is provided a method for producing a substrate (600) suitable for supporting an elongated superconducting element, wherein, e.g., a deformation process is utilized in order to form disruptive strips in a layered solid element, and where etching is used to form undercut volumes (330, 332) between an upper layer (316) and a lower layer (303) of the layered solid element. Such relatively simple steps enable providing a substrate which may be turned into a superconducting structure, such as a superconducting tape, having reduced AC losses, since the undercut volumes (330, 332) may be useful for separating layers of material. In a further embodiment, there is placed a superconducting layer on top of the upper layer (316) and/or lower layer (303), so as to provide a superconducting structure with reduced AC losses.

18 Claims, 13 Drawing Sheets

(56) References Cited

U.S. PATENT DOCUMENTS

| | | | |
|---|---|---|---|
| 4,256,816 A | 3/1981 | Dunkleberger | |
| 4,264,916 A | 4/1981 | Tsang | |
| 4,533,431 A | 8/1985 | Dargent | |
| 5,212,147 A | 5/1993 | Sheats | |
| 7,593,758 B2 * | 9/2009 | Foltyn | H01L 39/248 174/125.1 |
| 2007/0191202 A1 | 8/2007 | Foltyn et al. | |

FOREIGN PATENT DOCUMENTS

| | | |
|---|---|---|
| EP | 1788641 A2 | 5/2007 |
| EP | 2410586 A1 | 1/2012 |

OTHER PUBLICATIONS

Zhang Y et al., "AC Loss Reduction in Filamentized YBCO Coated Conductors With Virtual Transverse Cross-Cuts", IEEE Transaction on Applied Super Conductivity, vol. 21, No. 3, Jun. 2011, pp. 3301-3306.

Alenka Kosmac, "Electropolishing Stainless Steels", Euro Inox, Materials and Applications Series, vol. 11, ISBN: 978-2-87997-310-4, © Euro Inox 2010.

International Search Report for PCT/DK2013/050148, dated Sep. 9, 2013.

International Preliminary Report on Patentability for PCT/DK2013/050148, dated Nov. 25, 2014.

* cited by examiner

METHOD FOR PRODUCING SUBSTRATES FOR SUPERCONDUCTING LAYERS

FIELD OF THE INVENTION

The present invention relates to a method for producing substrates, and in particular relates to substrates suitable for supporting an elongated superconducting element, and a corresponding method for producing and using such substrates.

BACKGROUND OF THE INVENTION

Superconducting structures may be seen as advantageous since they enable conducting current without resistive losses. Superconducting structures, such as superconducting tapes are thus being used for a number of applications, such as generators and transformers. However, although they possess excellent properties when carrying direct current, they may exhibit high losses when used in alternating current (AC) applications.

Means of reducing AC losses that are currently available may not in a straightforward manner be adapted to processing long lengths of superconducting tape.

In the application U.S. Pat. No. 7,593,758 B2 there is presented a tape which has a high temperature superconductor layer that is segmented. Disruptive strips, formed in one of the tape substrate, a buffer layer, and the superconducting layer create parallel discontinuities in the superconducting layer that separate the current-carrying elements of the superconducting layer into strips or filament-like structures. Segmentation of the current carrying elements has the effect of reducing AC losses. Methods of making such a superconducting tape and reducing AC losses in such tapes are also disclosed.

In the application U.S. Pat. No. 4,101,731 there is presented a composite multifilament superconducting structure is provided, which includes an elongated substrate-carrying, longitudinally-directed, sputtered discrete filament of an A-15 type intermetallic superconductor. In a preferable procedure, a plurality of spaced, generally longitudinal grooves are formed on the surface of an elongated filamentary substrate, preferably a metal wire. The walls of the grooves on the substrate surface are shaped to undercut the curvilinear surface of the substrate located between two adjacent grooves so that at least some of the wall portions of the grooves are geometrically shadowed during the subsequent sputtering step in which a superconductor is sputtered onto the substrate. In particular, a film of a suitable superconducting intermetallic compound having A-15 crystalline structure, such as $Nb_3Ge$, is thereupon sputtered onto the grooved substrate and deposits at the bottom of the grooves and at the surface portions of the substrate between grooves. The shadowed wall portions remain substantially deposit-free so that the resultant spaced deposits extend as distinct lines or bands along the substrate to thereby constitute the superconductive filaments. A plurality of such substrates may, if desired, be consolidated into a further composite structure, by bundling the substrates and passing same through a molten metal. The resultant structure may then be sized to yield as a foral product a composite of the substrates bearing the superconducting filaments in a surrounding matrix of the metal.

It may be seen as a problem with the prior art methods that they are not adaptable to continuous processing of long lengths of such tape, effective, cheap, enabling low material consumption and/or provides a good substrate for a superconducting tape. It would be advantageous to have a method for making a substrate for a superconducting tape having reduced AC losses, wherein the method is adaptable to continuous processing of long lengths of such tape and which method would be effective, cheap and/or would be a method which provided an improved substrate for a superconducting tape compared to the prior art.

SUMMARY OF THE INVENTION

It is a further object of the present invention to provide an alternative to the prior art.

In particular, it may be seen as an object of the present invention to provide a method of making a substrate for a superconducting tape having reduced AC losses which is adaptable to continuous processing of long lengths of such tape and which method is effective, cheap and/or which provides an improved substrate for a superconducting tape that solves the above mentioned problems of the prior art.

Thus, the above described object and several other objects may be obtained in a first aspect of the invention by providing a method for producing a substrate suitable for supporting an elongated superconducting element, such as a superconducting tape having reduced AC losses, the method comprising, such as comprising the steps of:

Providing a layered solid element, the layered solid element comprising
  a lower layer, such as a nickel based alloy, such as a Hastelloy, such as a stainless steel, and
  an upper layer, such as a gas-hardened layer, such as a deformation hardened layer, such as an oxide layer, such as a nitride layer, such as a Kapton® film, such as a wax, such as lacquer,
wherein the upper layer is placed adjacent to the lower layer and at least partially covers the lower layer, Forming, such as forming in a deformation process, a plurality of disruptive strips in the upper layer thereby forming a plurality of exposed areas of the lower layer, where each exposed area is formed along a disruptive strip, Etching the exposed areas so as to form undercut volumes between the upper layer and the lower layer, where each undercut volume is formed along a disruptive strip, wherein an etchant is employed for which an etch rate for the lower layer is higher than an etch rate for the upper layer.

The invention is particularly, but not exclusively, advantageous for obtaining a method for producing a substrate suitable for supporting an elongated superconducting element, which method enables employing a large number of lower layer materials, i.e., the method enables choosing between many different materials for the lower layer, since there is no need for anisotropic etch rates in order to achieve the undercuts. Another advantage may be that the method enables choosing between many different materials for the upper layer. For example, the upper layer may be a buffer layer, such as dip-coated buffer layer, which may be advantageous in that when disruptive strips are formed, the remaining portions of the upper layer may immediately be ready for deposition of a superconducting layer. Furthermore, the substrate generated by the method enables efficiently separating closely spaced lines of superconducting material.

The gist of the invention may be seen as providing a method which in a few relatively simple steps enables providing a substrate which may be turned into a superconducting structure, such as a superconducting tape, having reduced AC losses. The basic insight underlying the invention may be described as the insight that undercut volumes (such as undercut volumes in a structure, such as a layered solid element) may be useful for separating layers of material which are positioned on top of the structure which comprises the undercut volumes, and that the undercut volumes may be formed by etching in a layered solid element where an anisotropy has been introduced by the layered structure, (which may also be referred to as "sandwich structure") where the layers differ in etch rates with respect to each other, and where disruptive strips may be formed in a deformation process, a scratching process, a grinding process or a polishing process or a similar process which enables removing or displacing the upper layer along a line and thereby exposing areas of the lower layer along a strip. Thus, relatively simple steps, for example hardening (thereby providing an upper layer in a layered solid element), deforming (thereby forming disruptive strips) and etching (thereby forming the undercuts), may be employed in combination so that a solution to the technical problem of 'providing a method which in a few relatively simple steps enables providing a substrate which may be turned into a superconducting structure' may be achieved. In another set of relatively steps, an oxide/nitride layer may be formed as the upper layer, disruptive strips may then be formed in this oxide/nitride layer and undercuts may be formed via etching. The superconducting element or superconducting structure may be realized by, e.g., depositing a layer of superconducting material on top of the layered solid element wherein undercuts have been formed along disruptive strips. The undercuts serve to physically separate the superconducting material on either side of each disruptive strip and superconducting material within the disruptive strip, thereby effectively forming a striated superconducting layer.

The method is furthermore applicable, such as well-suited, for large-scale manufacturing, since it is a relatively simple procedure to, e.g., harden a surface and perform, e.g., a deformation in the hardened surface, or a scratching in the hardened surface or grinding a portion of the hardened surface off, even on a large scale. This is in contrast to, e.g., profiling and etching using lithographic techniques which are not applicable for large scale manufacturing as a photoresist has to be coated, exposed to e.g. UV-light and following developed to produce protecting strips which are not etched in a subsequent etching treatment. Furthermore, removed material is not reusable.

Thus, large scale manufacturing is possible with embodiments of the invention, and furthermore, this is possible while minimizing material costs.

Embodiments of the invention may furthermore be seen as cost effective, which is in contrast to, e.g., laser stripping which is not considered cost effective. It may also be seen as an advantage over laser stripping that embodiments of the present invention might not suffer from redeposition of stripped material.

It may be understood that the steps are not necessarily arranged in the order in which they are to be carried out. For example, in one embodiment the step of forming the plurality of disruptive strips in the upper layer, may be carried out before the step of providing a layered element comprising the lower layer and the upper layer. For example, a striated upper layer may be provided, e.g., by means of a plurality of strips of Kapton® film which are placed adjacent to the lower layer and at least partially covering the lower layer, such that the areas between the strips of Kapton® film form disruptive strips which entail exposed areas. However, in another embodiment, the step of providing the layered solid element may be carried out (e.g., by oxidizing or gas-hardening an upper portion of a primary upper layer of a primary solid element) before forming the plurality of disruptive strips in the upper layer.

Throughout this application, it is understood that 'Kapton® film' refers to the well-known product from DuPont™ which is a film of poly(4,4'-oxydiphenylene-pyromellitimide).

In yet another embodiment, the steps are arranged in the order in which they are to be carried out.

By 'a substrate suitable for supporting an elongated superconducting element' is understood a solid element upon which a superconducting material may be placed, such as deposited, so that the substrate and the superconducting element may together form an elongated superconducting element. By elongated superconducting element is understood a superconducting element which is able to conduct current a distance in a direction, where the distance is longer, such as significantly longer, such as 2, 5, 10, 100, 1.000, 10.000 or 100.000 times longer than the width of the conductor in a direction orthogonal to the direction in which current is conducted.

In a particular embodiment, the substrate is a 'tape', i.e., an element which has thickness (length along a first dimension) which is significantly smaller, such as 10, 100 or 1000 times smaller, than its width (length along a second dimension) and where the width is significantly smaller, such as 10, 100, or 1.000 times smaller, than its length (length along a third dimension).

Providing a layered solid element, may be understood as any one of: Obtaining a (pre-manufactured) layered solid element and manufacturing a layered solid element. Manufacturing a layered solid element may in particular embodiments comprise placing an upper layer (of material) on top of a lower layer (of material), or changing the properties of an upper portion of a material, so as to effectively achieve an upper layer and a lower layer (of a material which was previously a homogeneous material). The step of placing an upper layer of material on top of a lower layer, may be embodied by placing a film, such as a Kapton® film, a wax or a lacquer on top of the lower layer. In different embodiments, disruptive strips in the upper layer may be formed before and/or after it is placed on the lower layer.

By 'a lower layer' and an 'upper layer' is understood layers which are placed adjacent to each other in a parallel orientation and being displaced with respect to each other along a direction being orthogonal to the plane of each of the layers.

It is understood that when the upper layer is placed adjacent to the lower layer and at least partially covers the lower layer, then the upper layer may shield the lower layer so that an etchant placed on the upper layer may not access the lower layer, such as at least not access the portions of the lower layer which are covered by the upper layer.

By 'disruptive strip' is understood a line of lack of upper layer material which separates the upper layer material into upper layer material on both sides of the disruptive strip. A disruptive strip may be seen as a gap in an otherwise coherent material. If a coherent material, such as a coherent layer of material, is traversed by a disruptive strip, the continuity of the coherent material is thus disrupted into two separate (layers of) material.

By 'exposed areas of the lower layer' is understood that the portions of the lower material, i.e., the lower layer, which might previously have been covered by the upper layer may be exposed, so that the exposed areas may be susceptible to etching without removing further portions of the upper layer.

By 'etching the exposed areas' is understood that the exposed areas of the lower material are etched with an etchant. The etchant may in particular embodiments be in any one of the following states of matter: plasma, liquid and gas. In a particular embodiment Reactive Ion Etching (RIE) is employed.

In terms of directions, it is understood when referring to 'up' that an up-down axis is defined as being in a direction orthogonal to the plane of the interface between the upper and lower layer, and that 'up' is in the direction from the lower layer to the upper layer, and vice versa for the direction 'down'. It is understood that the up-down axis is parallel to a y-axis as indicated in the figures, and that 'up' is in the positive y-direction. This definition of direction also applies when using the terms 'above' and 'below' which are given their general meaning.

By 'undercut volumes' is understood volumes etched in the lower layer, which volumes may be below remaining portions of the lower layer and/or the upper layer. Thus an undercut volume may be shadowed by overhanging portions of the upper layer and/or the lower layer. Thus, when a material is deposited on the sandwich comprising the upper layer and lower layer (or the lower layer, such as only the lower layer, such as after removal of the upper layer), using a line-of-sight process for deposition of material in a direction following the up-down-axis from a position above the sandwich comprising the upper layer and lower layer (or the lower layer), and undercut portions have been formed in the lower layer, then the material is not deposited on the portions of the upper layer and lower layer (or the lower layer) which borders the undercut volumes.

By an 'etchant for which the etch rate for the lower layer is higher than the etch rate for the upper layer' is understood an etchant which etches more material of the undercut volume (i.e., etches more length units per time unit) in the material of the lower layer than in the material of the upper layer.

By 'hastelloy' is understood an alloy wherein the predominant alloying ingredient is nickel and wherein other alloying ingredients are added, such as the alloy comprising varying percentages of one or more of, such as all of, the elements: molybdenum, chromium, cobalt, iron, copper, manganese, titanium, zirconium, aluminium, carbon, and tungsten. In a particular embodiment, hastelloy is an alloy which comprises the elements Ni, Cr, Fe, Mo, Co, W, C. In a more particular embodiment, the alloy also comprises Ni, Cr, Fe, Mo, Co, W, C and one or more of the elements Mn, Si, Cu, Ti, Zr, Al and B. In a more particular embodiment, the alloy is understood to comprise approximately 47 wt % Ni, 22 wt % Cr, 18 wt % Fe, 9 wt % Mo, 1.5 wt % Co, 0.6 wt % W, 0.10 wt % C, less than 1 wt % Mn, less than 1 wt % Si and less than 0.008 wt % B. Hastelloy may be referred to as "superalloy" or a "high-performance alloy" within the art.

'Stainless steel' is generally known in the art. In particular embodiments, there is provided stainless steel with nickel and/or chromium, such as to provide a stainless steel which is corrosion and/or oxidation resistant, mechanically stable and non-magnetic at the operation temperature of the superconducting layer.

The invention may in particular embodiments encompass having one or more intermediate layers of material inserted between the upper and the lower layer, such as having one or more intermediate layers separating the upper and lower layer, such as the one or more intermediate layer functioning as a barrier for any one of heat, current and diffusion of atoms, ions and/or molecules between the upper and lower layer. An advantage of having one or more intermediate layers may be that it improves the mechanical properties, such as making the layered solid element stronger or more rigid. It is thus understood that the wording 'adjacent to' does not necessarily imply that upper layer and the lower layer are in direct physical contact. However, in a specific embodiment, the upper layer and the lower layer are in direct physical contact.

In another embodiment, there is provided a method for producing a substrate suitable for supporting an elongated superconducting element, wherein the undercut volumes are below remaining portions of the lower layer, such as the undercut volumes being shadowed by overhanging portions of the lower layer. It may thus be understood, that the undercut volumes are positioned so that a portion of the lower layer is below the undercut volumes and another portion of the lower layer is above the undercut volume. A possible advantage of this embodiment may be, that the undercut volumes may still be present even if the upper layer is removed. A possible advantage of this may be, that the upper layer may not be considered beneficial for the further processing and/or for the properties of a final elongated superconducting element.

In a particular embodiment, there is provided a method for producing a substrate suitable for supporting an elongated superconducting element wherein the step of forming a plurality of disruptive strips in the upper layer thereby forming a plurality of exposed areas of the lower layer, where each exposed area is formed along a disruptive strip, comprises a deformation process. In a particular embodiment, the deformation process comprises deforming, such as compressing, a portion of the lower layer below the positions of the disruptive strips, so as to lower portions of the upper layer below the original position of the plane of the upper layer, so as to expose areas of the lower layer.

By 'a deformation process' is understood a process wherein material is deformed such as by a process where material, such as the material of the upper layer and/or the lower layer, is deformed. A deformation process may be understood as a process involving contact forces.

In alternative embodiments, the deformation process may be replaced with any one of a cutting process, a scratching process, a grinding process and a polishing process.

By a 'scratching process' is understood that a portion of the upper layer and possibly a portion of the lower layer is scratched off, such as scraped off.

By 'a grinding process' is understood that a portion of the upper layer and possibly a portion of the lower layer removed by grinding process or polishing, such as repeatedly scraping off minor portions of the material to be removed. A 'polishing process' is understood to be similar to a 'grinding process' in the present context.

By a 'cutting process' is understood a process wherein material is displaced, such displaced rather than removed. This may be achieved using a relatively sharp tool.

In another embodiment, there is provided a method for producing a substrate suitable for supporting an elongated superconducting element wherein the step of providing the layered solid element comprises Providing a primary solid element, the primary solid element having a primary upper layer being substantially uniform, Forming the upper layer of the layered solid element by any one of:

i. Hardening an upper portion of the primary upper layer, such as hardening in a gas hardening process, ii. doping an upper portion of the primary upper layer,
iii. preparation of an oxide layer or a nitride layer within an upper portion of the primary upper layer.

It is understood that the primary upper layer of the primary solid element may thus be changed into the upper layer (corresponding to the upper portion of the primary upper layer), and the lower layer (corresponding to the at least a part of the portion of the primary upper layer which is not the primary upper layer, such as corresponding to the portion of the primary upper layer which is not the upper portion of the primary upper layer).

An exemplary gas hardening process could comprise the steps of heating the substrate to an elevated temperature, such as at least 500 degrees Celsius, such as at least 800 degrees Celsius, such as at least 1000 degrees Celsius, within a furnace, and filling the furnace with a controlled gas (such as nitrogen, carbon, boron or oxygen, which may be provided with at least 99.9% purity), so as to produce the desired thickness of the hardened layer. The thickness of the hardened layer may be controlled by varying the amount of time the controlled gas is within the furnace, the temperature within the furnace and/or the composition of the controlled gas. An exemplary dopant for doping could be nitrogen, carbon, oxygen. A possible advantage of employing gas hardening may be that it enables providing a very uniform hardening.

An exemplary process for forming an oxide layer or a nitride layer could comprise the steps of heating the substrate to an elevated temperature, such as at least 500 degrees Celsius, such as at least 800 degrees Celsius, such as at least 1000 degrees Celsius, within a furnace, and filling the furnace with a controlled gas (such as nitrogen or oxygen, which may be provided with at least 99.9% purity) so as to produce the desired thickness of the nitride/oxide layer. The thickness of the hardened layer may be controlled by varying the amount of time the controlled gas is within the furnace, the temperature within the furnace and/or the composition of the controlled gas.

It is also encompassed by the present invention that an upper layer may be formed by employing the processes of solid diffusion-, plasma- and salt bath based methods.

In another embodiment, there is provided a method for producing a substrate suitable for supporting an elongated superconducting element wherein the step of forming in a deformation process a plurality of disruptive strips in the upper layer comprises pressing a portion of the upper layer into the lower layer, such as in a rolling step, such as in a cold rolling step, such as when transferring the tape substrate from one reel to another, such as in a drawing process.

By 'pressing' is understood a pressing step which is understood to be a step wherein material is displaced using a compressive contact force applied via another element, such as a roller. An advantage of employing a pressing step may be that it enables deforming material, such as forming the plurality of disruptive strips in a simple, cheap, and/or efficient manner. In a particular embodiment, there is removed no material. This may be possible because material is displaced, such as compressed. Another possible advantage of employing a pressing step may be that it can result in a hardening, such as a deformation hardening, which may increase the overall yield strength and/or the hardness of the substrate, such as the hardness of the lower layer.

By a 'drawing process' is understood a process wherein at least the upper layer and a portion of the lower layer is deformed in a plastic deformation, such as in an irreversible deformation, such as by drawing it through a die so as to change shape of the profile. By 'profile' is understood the shape of the upper layer and a portion of the lower layer in a plane, such as a cross section, being orthogonal to the direction of drawing.

In another embodiment, there is provided a method for producing a substrate suitable for supporting an elongated superconducting element wherein a thickness of the upper layer of the layered solid element is within 1 nm-100 micrometer, such as within 10-1000 nm, such as within 0.1 nm-10 mm, such as within 1 nm-1 mm, such as within 1 nm-0.1 mm, such as within 1-10000 nm, such as within 1-1000 nm, such as within 1-100 nm, such as within 10 nm-1 mm, such as within 10 nm-0.1 mm, such as within 10 nm-10000 nm, such as within 10-1000 nm, such as within 100 nm-1 mm, such as within 100 nm-0.1 mm, such as within 100 nm-10000 nm, such as within 100-1000 nm, such as less than 10 nm, such as less than 100 nm, such as less than 1000 nm, such as less than 10000 nm, such as less than 0.1 mm, such as less than 1.0 mm, such as less than 10 mm. An advantage of having a relatively thin thickness may be that it reduces the time for providing the upper layer, such as the time for growing or depositing the material of the upper layer. An advantage of not having the upper layer being too thin may be that a too thin layer may not be robust enough.

In another embodiment, there is provided a method for producing a substrate suitable for supporting an elongated superconducting element wherein a distance between adjacent disruptive strips within the plurality of disruptive strips is within 1 micrometer-1 millimeter, such as within 10-100 micrometer, such as within 0.1 nm-10 mm, such as within 1 nm-1000 micrometer, such as within 1 nm-100 micrometer, such as within 1 nm-10 micrometer, such as within 10 nm-1000 micrometer, such as within 10 nm-100 micrometer, such as within 10 nm-10 micrometer, such as within 100 nm-1000 micrometer, such as within 100 nm-100 micrometer, such as within 100 nm-10 micrometer, such as within 1-1000 micrometer, such as within 1-100 micrometer, such as within 1-10 micrometer, such as within 10-1000 micrometer, such as within 20-200 micrometer, such as within 100-1000 micrometer, such as less than 10 micrometer, such as less than 100 micrometer, such as less than 200 micrometer, such as less than 1000 micrometer, such as less than 10 mm. An advantage of having the distance between adjacent disruptive strips within this range may be that it enables reducing AC losses. It is to be understood that the distance between disruptive strips is to be measured in a direction being parallel to the plane of the interface between the upper and lower layer, and orthogonal to the direction of the disruptive strips. The disruptive strips may in particular embodiments be substantially parallel, such parallel.

In another embodiment, there is provided a method for producing a substrate suitable for supporting an elongated superconducting element wherein a width of the disruptive strips may be 1 micrometer, such as 2 micrometer, such as 5 micrometer, such as 10 micrometer, such as 30 micrometer, such as 100 micrometer, such as 1 mm, such as 4 mm, such as 5 mm, such as 10 mm, such as within 1 micrometer-1 mm, such as 1 micrometer-10 mm, such as 1 mm-10 mm. An advantage of having the width in this range may be that it enables physically separating layers deposited on the substrate. It is to be understood that the width is to be measured in a direction being parallel to the plane of the interface between the upper and lower layer, and orthogonal to the direction of the disruptive strips.

In another embodiment, there is provided a method for producing a substrate suitable for supporting an elongated superconducting element according to any of the preceding claims, wherein a distance between a plane being parallel with the upper surface of the lower layer or the upper surface of the upper layer, and a plane being tangential to the bottom of the plurality of disruptive strips is large enough so as to enable that a superconducting material placed on the substrate will have portions in the disruptive strips and between the disruptive strips which portions are physically separated. In particular embodiments, said distance is within 50 nm-10 micrometer. It is understood that when referring to "on the substrate", that the superconducting material may be deposited on the upper layer (being outside of the disruptive strips) and within the disruptive strips, but it is also understood that in particular embodiments, the method may comprise removing the upper layer in which embodiments the superconducting material may be deposited on the lower layer (being outside of the disruptive strips) and within the disruptive strips.

In another embodiment, there is provided a method for producing a substrate suitable for supporting an elongated superconducting element wherein a distance between a plane being parallel with an upper surface of the lower layer, and a plane being tangential to the bottom of the plurality of disruptive strips is within 50 nm-10 micrometer, such as within 1-100 micrometer, such as within 0.1 nm-10 mm, such as within 1 nm-1000 micrometer, such as within 1 nm-100 micrometer, such as within 1 nm-10 micrometer, such as within 10 nm-1000 micrometer, such as within 10 nm-100 micrometer, such as within 10 nm-10 micrometer, such as within 0.1-1000 micrometer, such as within 0.1-1000 micrometer, such as within 0.1-100 micrometer, such as within 0.1-10 micrometer, such as within 1-1000 micrometer, such as within 1-10 micrometer, such as within 10-1000 micrometer, such as within 10-100 micrometer, such as less than 10 micrometer, such as less than 100 micrometer, such as less than 200 micrometer, such as less than 1000 micrometer, such as less than 10 mm.

In another embodiment, there is provided a method for producing a substrate suitable for supporting an elongated superconducting element wherein a distance between a plane being parallel with an upper surface of the upper layer, and a plane being tangential to the bottom of the plurality of disruptive strips is within 50 nm-10 micrometer, such as within 1-100 micrometer, such as within 0.1 nm-10 mm, such as within 1 nm-1000 micrometer, such as within 1 nm-100 micrometer, such as within 1 nm-10 micrometer, such as within 10 nm-1000 micrometer, such as within 10 nm-100 micrometer, such as within 10 nm-10 micrometer, such as within 0.1-1000 micrometer, such as within 0.1-1000 micrometer, such as within 0.1-100 micrometer, such as within 0.1-10 micrometer, such as within 1-1000 micrometer, such as within 1-10 micrometer, such as within 10-1000 micrometer, such as within 10-100 micrometer, such as less than 10 micrometer, such as less than 100 micrometer, such as less than 200 micrometer, such as less than 1000 micrometer, such as less than 10 mm.

In another embodiment, there is provided a method for producing a substrate suitable for supporting an elongated superconducting element, such as a method for producing an elongated superconducting element, wherein the method further comprises placing, such as depositing, a layer of superconducting material on the upper layer and/or lower layer of the layered solid element so that the undercut volumes serve to physically separate individual lines of superconducting material. An advantage of placing a layer of superconducting material on the upper layer and/or lower layer of the layered solid element may be that it enables providing a superconducting structure. An advantage of placing a layer of superconducting material on the upper layer and/or lower layer of the layered solid element so that the undercut volumes serve to physically separate individual lines of superconducting material may be that it enables providing a plurality of lines of superconducting material which are physically separated and hence effectively reduce the AC losses. A possible advantage is that it enables low material consumption, since no superconducting material need to be removed in order to realize the physical separation.

In another embodiment, there is provided a method for producing a substrate suitable for supporting an elongated superconducting element, such as a method for producing an elongated superconducting element, wherein the method further comprises placing, such as depositing,
    a layer of buffer material on the upper layer and/or lower layer of the layered solid element, and
    a layer of superconducting material on the buffer material,
    so that the undercut volumes serve to physically separate individual lines of superconducting material and/or buffer material.

A possible advantage of placing a layer of buffer material on the upper layer and/or lower layer of the layered solid element may be that it enables placing a layer of superconducting material on top of the buffer layer, where the superconducting properties of the superconducting layers are improved and/or protected by being placed on the buffer layer, as opposed to being placed directly on the upper layer and/or lower layer. More specifically, the superconducting material may be improved since the buffer material may provide a texture which is advantageous in terms of improving the superconducting properties of the superconducting material. For example, if a substrate has a relatively rough substrate, then placing a buffer layer on such substrate may enable achieving a roughness (of the buffer—and hence the surface on which a superconducting layer is to be placed) of, e.g., $0.1$ $nm_{RMS}$-$10$ $nm_{RMS}$. More specifically, the superconducting material may be protected since the buffer material may provide a barrier against potentially harmful elements (in terms of superconducting properties), such as atoms, ions and/or molecules which could have diffused from the upper layer and/or lower layer and into the superconducting material, and thereby deteriorate the superconducting properties. An advantage of placing a layer of superconducting material on the buffer material may be that it enables providing a superconducting structure. An advantage of doing it so that the undercut volumes serve to physically separate individual lines of superconducting material and/or buffer material may be that it enables providing a plurality of lines of superconducting material which are physically separated and hence effectively reduce the AC losses. The thickness of the layer of the superconducting material (in a direction orthogonal to the plane of the upper layer and the lower layer) may be 100 nm, such as 1000 nm, such as 3 micrometer, such as 5 micrometer, such as within the range of 100 nm-3 micrometer, such as within a range of 100 nm-5 micrometer. It is noted that and advantage of having relatively thin superconducting layers may be that too thick layers becomes brittle and may fracture upon bending/winding into e.g. a coil. Very thick superconductor layers (made of Yttrium barium copper oxide, a crystalline chemical compound with the formula $YBa_2Cu_3O_7$-x (YBCO)) are known to have a lower critical current density compared with thinner layers. Multilayers of YBCO with intermediate buffer layers is one method for producing an effective thick superconductor stack with an overall higher critical current.

It is understood, that in order to obtain the advantage of having electrically decoupling adjacent lines, it may not be necessary that the lines of layer of material which is superconducting when placed on the buffer material is itself physically separated from adjacent lines. It may be sufficient that lines of buffer material are separated so that the layer of superconducting material is only superconducting along (and above) the lines of buffer material, whereas the corresponding lines of material in between are not superconducting.

In an embodiment, there is provided a method for producing a substrate suitable for supporting an elongated superconducting element, such as a method for producing an elongated superconducting element, wherein the method further comprises placing, such as depositing, a layer of superconducting material on the upper layer and/or lower layer of the layered solid element so that the undercut volumes serve to physically separate individual lines of superconducting material, and the method further comprising placing, such as depositing, a layer of buffer material on the superconducting material, such as on top of the superconducting material, such as on the side of the superconducting material being away from the lower layer.

Strong texture and epitaxial growth of e.g. superconducting YBCO may be difficult to obtain for very thick layers (such as 500 nm-5 μm thickness). It is noted that texture and epitaxial growth decay at high superconductor YBCO layer thicknesses. A possible advantage of placing an (extra) layer of buffer material on the superconducting material may be that the superconducting properties of an additional superconducting layer (deposited on top of the extra buffer layer) may be improved, since the (extra) buffer layer again increases the fraction of texture and level of epitaxial growth. Thus, a possible advantage of placing a layer of buffer material on the superconducting material may be that it enables forming a 'stack' of high quality superconducting films.

In another embodiment, there is provided a method for producing a substrate suitable for supporting an elongated superconducting element, such as a method for producing an elongated superconducting element, wherein the step of placing, such as depositing, a layer of superconducting material and/or buffer material is a line-of-sight process, such as a physical vapour deposition process, such as a pulsed laser deposition process, such as RF sputtering, such as E-beam evaporation, such as Ion Beam Assisted Deposition (IBAD).

By a 'line-of-sight' process is understood any process which enables depositing material only on positions of a substrate which may be seen along a straight line from another position, such as a position above the substrate. 'Line-of-sight' process is thus construed broadly to comprise processes where the deposited material follows straight lines prior to deposition and processes for deposition which has a similar effect. In a particular embodiment, the line-of-sight process is any one of die coating, bubble jet coating and ink jet coating.

A possible advantage of using a line-of-sight process may be that it enables depositing material only outside of the undercut volumes, and thus enables in a simple step to simultaneously achieve deposition of material outside the undercut volumes and achieve that there is no deposition of material within the undercut volumes.

In particular embodiments, 'line-of-sight' is understood to be a process wherein the deposited material has its origin from a source and travels in a direct line therefrom to the position where it is deposited. In other words, there can only be deposited material on positions from which there can be drawn a straight line to the source which does not traverse any obstacles. In a particular embodiment, the source is above the undercut volumes. In another embodiment, the source is so far above the lower layer, that virtual lines from the source to different positions within the undercut volumes are substantially parallel.

In another embodiment, there is provided a method for producing a substrate suitable for supporting an elongated superconducting element, such as a method for producing an elongated superconducting element, wherein the method further comprising placing a shunt layer on the layer of superconducting material.

By a 'shunt layer' is understood a layer of material which is placed on the layer of superconducting material, which has high thermal conductivity and high electrical conductivity. An advantage of having a shunt layer may be, that if the an underlying superconductor does not conduct well at a certain point, the current may pass this (low conductivity) point via the (high conductivity) shunt layer thereby avoiding a failure of the structure due to resistive heating. Exemplary materials of the shunt layer may comprise silver (Ag) and/or copper (Cu) and/or gold (Au). The shunt layer is not chemically active with respect to the layer of superconducting material. The undercut volumes may be advantageous with respect to the shunt layer as the undercut volumes associated with the disruptive strips may also physically separate the shunt layer, such as physically separate the shunt layer material on either side of each disruptive strip and shunt layer material within the disruptive strip, thereby effectively forming a striated shunt layer, such as turning the shunt layer into stripes of shunt layer material. An advantage of forming a striated shunt layer may be that it enables removing high conductivity contact (through the shunt layer) between the lines of superconducting material, which is also separated by the undercut volumes, while still being able to thermally conduct to the outer supporting structure and allowing current to pass potential points of low conductivity (in parallel with the normal current direction) thus both enabling normal cooling and protection of the superconductor in the event of a quench. The shunt layer may be placed on the superconducting material with methods known in the art, such as by deposition, sputter deposition, electrochemical deposition, galvanic deposition, or similar methods.

In another embodiment, there is provided a method for producing a substrate suitable for supporting an elongated superconducting element, such as a method for producing an elongated superconducting element, wherein the method further comprises introducing virtual cross-cuts in the substrate, the buffer layer and/or the superconducting material. Such virtual transverse cross-cuts may be beneficial for reducing AC loss. Virtual transverse cross-cuts are described in the reference "AC Loss Reduction in Filamentized YBCO Coated Conductors With Virtual Transverse Cross-Cuts", Zhang et al., IEEE TRANSACTIONS ON APPLIED SUPERCONDUCTIVITY, VOL. 21, NO. 3, JUNE 2011, 3301-3306, which is hereby incorporated by reference in entirety.

According to a second aspect of the invention, there is provided a substrate suitable for supporting an elongated superconducting element, such as a superconducting tape having reduced AC losses, the substrate comprising:

a layered solid element, the layered solid element comprising
  a lower layer, such as a nickel based alloy, and
  lines of an upper layer, such as a gas-hardened layer, such as a deformation hardened layer, such as an oxide layer,
wherein the lines of the upper layer is placed adjacent to the lower layer and partially covers the lower layer,
wherein a plurality of disruptive strips between the lines of the upper layer separates the lines of the upper layer,
and wherein undercut volumes are present between the lines of the upper layer and the lower layer, where each undercut volume is formed along a disruptive strip.

In another embodiment, there is provided a substrate suitable for supporting an elongated superconducting element, wherein the substrate is a tape.

According to a third aspect of the invention, there is provided an elongated superconducting element comprising:
  A substrate according to the second aspect,
  a superconducting layer placed, such as deposited, on the substrate so that the undercut volumes physically separates individual lines of superconducting material.

According to a fourth aspect of the invention, there is provided a use of an elongated superconducting element according to the third aspect, within any one of a performance magnetic coil, a transformer, a generator, a magnetic resonance scanner, a cryostat magnet, a particle accelerator, a large hadron collider, an AC power grid cable, a smart grid.

According to a fifth aspect, there is provided an apparatus for, such as arranged for, carrying out the method according to the first aspect.

The first, second, third, fourth and fifth aspect of the present invention may each be combined with any of the other aspects. These and other aspects of the invention will be apparent from and elucidated with reference to the embodiments described hereinafter.

BRIEF DESCRIPTION OF THE FIGURES

The first, second, third and fourth aspects according to the invention will now be described in more detail with regard to the accompanying figures. The figures show one way of implementing the present invention and is not to be construed as being limiting to other possible embodiments falling within the scope of the attached claim set.

DETAILED DESCRIPTION OF AN EMBODIMENT

Figure 1:
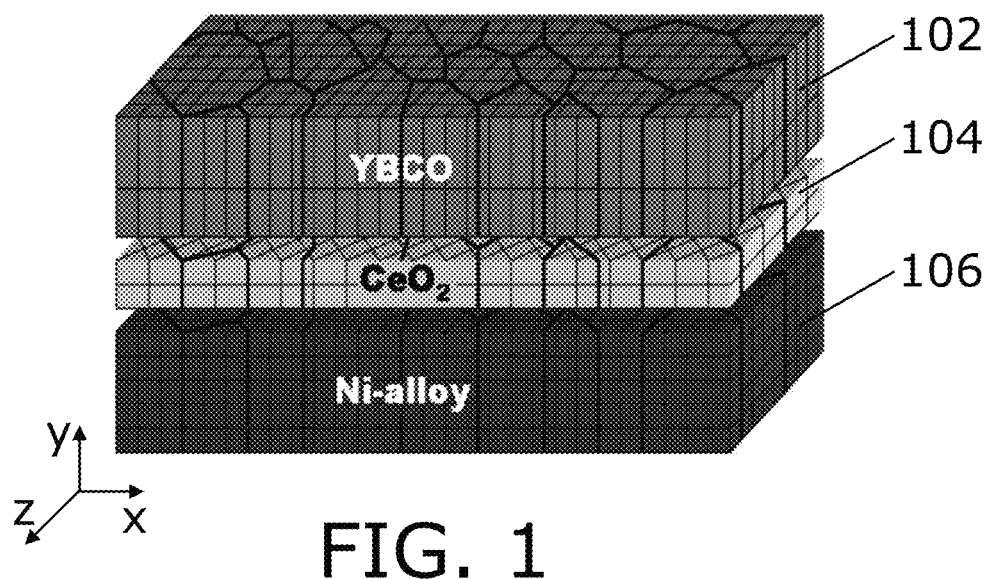
FIG. 1 shows a typical superconductor structure.

FIG. 1 shows a typical superconductor structure, which is a sandwich structure comprising a substrate 106, a buffer layer 104 and the superconducting material 102. In the present figure, the current is supposed to flow through the superconducting material 102 in the z-direction.

When the superconducting material is a relatively wide (where width is measured in the x-direction) layer of material, such as when formed as a layer on a wide planar substrate, the superconducting layer exhibits relatively large AC losses which could be reduced by turning the single, wide superconducting layer into a plurality of relatively narrow lines (i.e., lines with cross-sections in the yx-plane where the widths measured in the x-direction are smaller compared to the original, wide layer).

Figure 2:
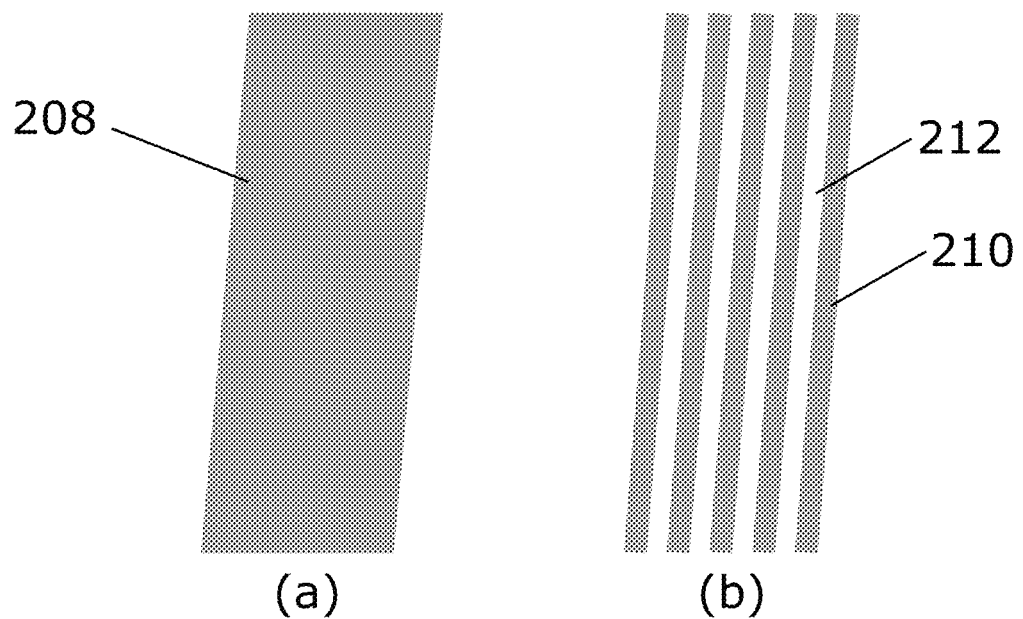
FIG. 2 illustrates a non-striated (a) and a striated (b) superconductor.

FIG. 2 is a top view of a superconducting material, where the left side (a) illustrates a non-striated superconductor 208 formed on a planar layer, and the right side (b) illustrates a striated superconductor, where individual lines 210 of superconducting material have been formed are separated from adjacent lines of superconducting material by non-superconducting lines 212. It is understood that current runs in a direction parallel to the lines, and that the width is the dimension of the lines in a direction orthogonal to the direction of the current.

Due to electromagnetic effects, AC losses are present in superconducting tapes, and this problem scales with the width of the superconductor. Consequently, it is suggested to overcome this problem by replacing the wide superconductor layer (corresponding to the superconductor layer in FIG. 2(b)) by a plurality of thin superconductor lines (corresponding to the separated, adjacent lines in FIG. 2(a)).

FIG. 3 shows steps of a fabrication process, and thus illustrates a method for producing a substrate suitable for supporting an elongated superconducting element, such as a superconducting tape having reduced AC losses.

Figure 3A:
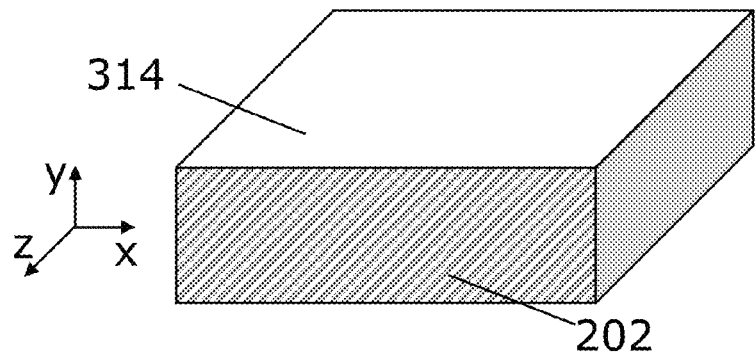
FIG. 3 shows steps of a fabrication process.

FIG. 3A shows a perspective view of a primary solid element 202, the primary solid element 202 having a primary upper layer 314 being substantially uniform.

Generally, the primary solid element material (tape/wire/cylinder) in an as-rolled (or as-prepared) condition and e.g. with a thickness close to the final thickness may be fully or partially annealed during a heat treatment in a protective atmosphere or air.

Figure 3B:
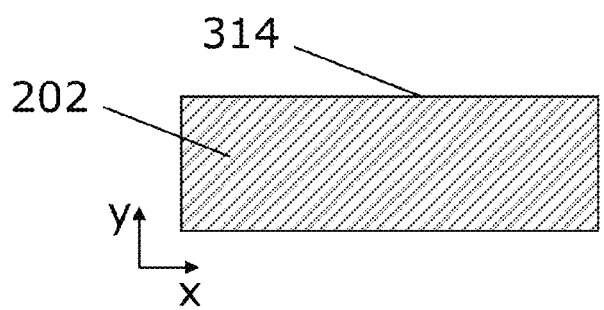

FIG. 3B shows a side view of the primary solid element where the side of the primary solid element 202 can be seen.

Figure 3C:
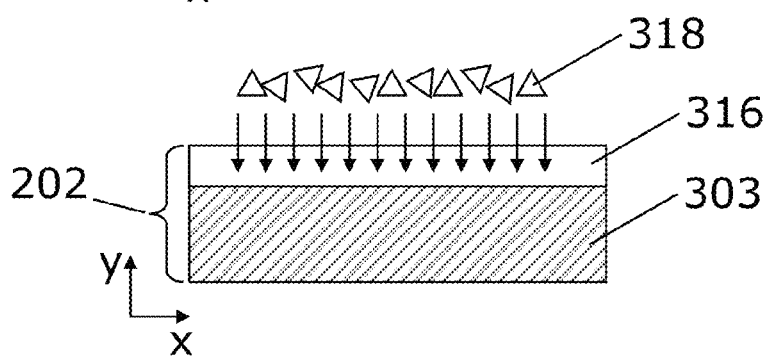

FIG. 3C shows a method step of making a layered solid element, the method step comprising forming the upper layer 316 of the layered solid element by hardening an upper portion of the primary upper layer 314, such as by hardening in a gas hardening process, as illustrated by gas atoms 318 diffusing into the primary upper layer 314. The lower portion of the primary solid element 202 is termed lower layer 303. Alternatively, the hardening could have been carried out using either doping an upper portion of the primary upper layer 314, or preparation of an oxide or nitride layer.

The figure thus shows a method of making a layered solid element, the layered solid element comprising a lower layer 303, such as a nickel based alloy, and an upper layer 316, such as a gas-hardened layer, wherein the upper layer is placed adjacent to the lower layer and at least partially covers the lower layer.

A surface hardening (or surface doping) shall be performed in order to significantly change the etching rate between upper layer 316 and the lower layer 303 (e.g., bulk material). This may be achieved by using dissolution of nitrogen atoms in the surface region (e.g., 10-1000 nm). The thickness of the actual layer may be optimized applying different doping atoms, durations, temperatures and pressures.

Figure 3D:
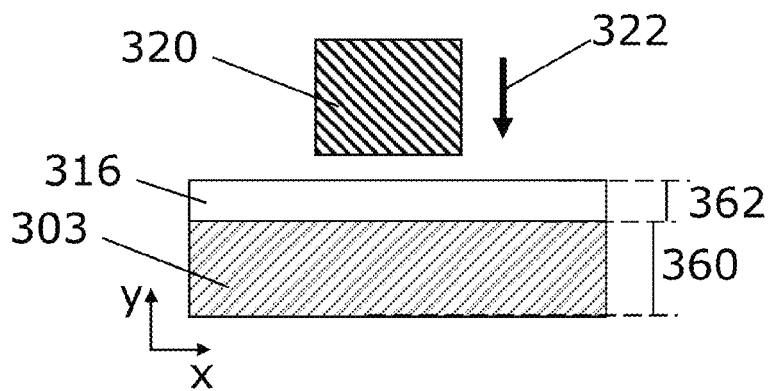

FIG. 3D shows preparation for a deformation step, the deformation step being a pressing step, such as a cold rolling step, where a pressing element 320 is ready to be pressed with a force 322 into the upper layer 316, through the upper layer 316 and into the lower layer 303. The figure furthermore indicates a thickness 360 of the lower layer 303, and a thickness 362 of the upper layer. Both of the thicknesses are measured in the y-direction.

Figure 3E:
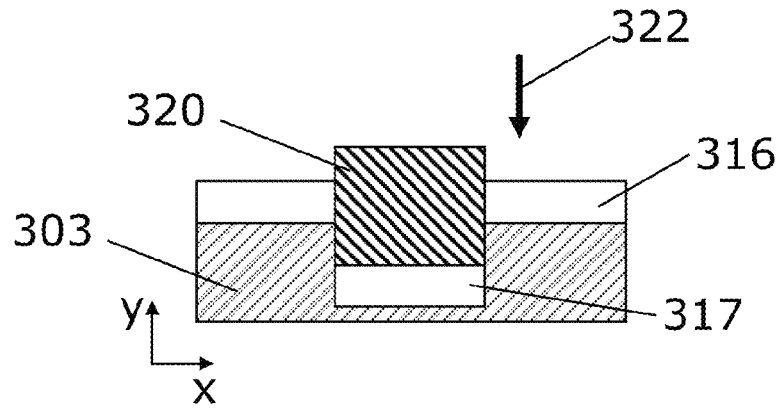

FIG. 3E shows the pressing step, where a pressing element 320 has been pressed with a force 322 into the upper layer 316, through the upper layer 316 and into the lower layer 303.

Thus in FIGS. 3D-E there is thus shown an example of a deformation process wherein a plurality of disruptive strips in the upper layer 316 (albeit only one is shown in the figure).

In this way, a surface profile with narrow stripes (e.g., 10-100 μm width and 1-100 μm depth) may be prepared by mechanical deformation (e.g. cold rolling). The resulting profiles may be optimized with respect to edge sharpness via the before mentioned annealing procedure to produce the most appropriate profile for under-etching.

Figure 3F:
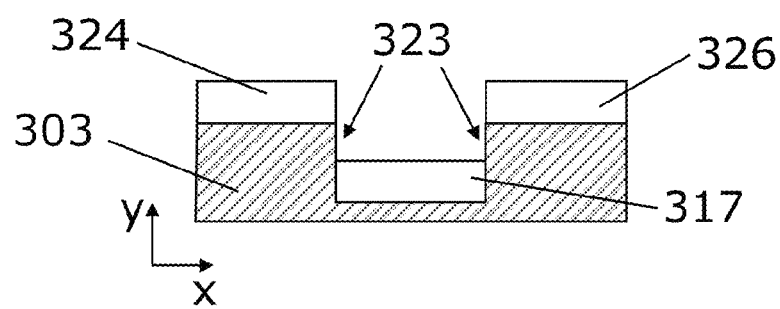

FIG. 3F shows the situation after the pressing step where a plurality of exposed areas 323 of the lower layer 303 are formed, where each exposed area is formed along a disruptive strip. The upper layer has been separated into upper portions 324, 326 and lower portions 317.

Figure 3G:
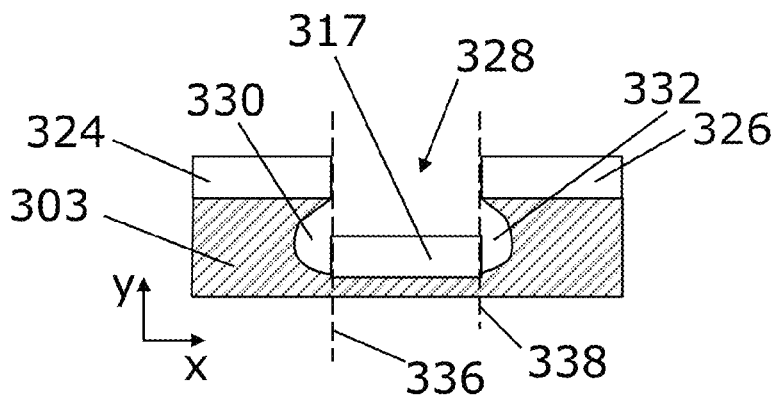

FIG. 3G shows a situation after etching of the exposed areas 323 so as to form a cavity forming a disruptive strip 328 with undercut volumes 330, 332 between the upper layer 324, 326 and the lower layer 303, such as forming portions of the lower layer which are shadowed when observed from above, where each undercut volume is formed along a disruptive strip, wherein an etchant is employed for which the etch rate for the lower layer 303 is higher than the etch rate for the upper layer 316 (or separated portions 324, 326, 317).

The etching may be performed by dipping the substrate material in an acidic solution (e.g. $3H_2O:2HNO_3:HF$) in approximately 5 minutes, such as 5 minutes. An electropolishing step may be introduced in addition (or instead of dipping) to control the etching rate of the individual acid applied in the experiment which also enabled reduction of the surface roughness. Residual acid may be removed using flowing distilled water/ethanol.

The resulting surface profile, cross-sectional profile and surface texture may be inspected using a means for measuring microtexture, such as a scanning electron microscope (SEM) equipped with an Electron Backscatter Diffraction Detector (EBSD) detector and which may in a particular embodiment employ software for measuring and analysing texture, such as HKL Technology-Channel 5 software. Note that texture measurements may only be necessary for textured substrate materials.

Figure 3H:
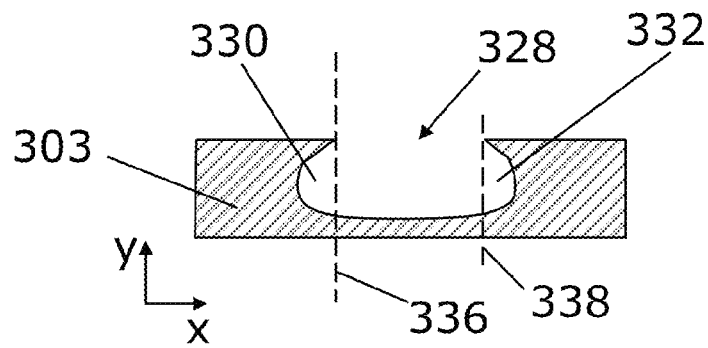

FIG. 3H shows a situation similar to the situation in FIG. 3G, where also the separated portions 324, 326, 317 of the upper layer 316 have been removed.

Figure 4:
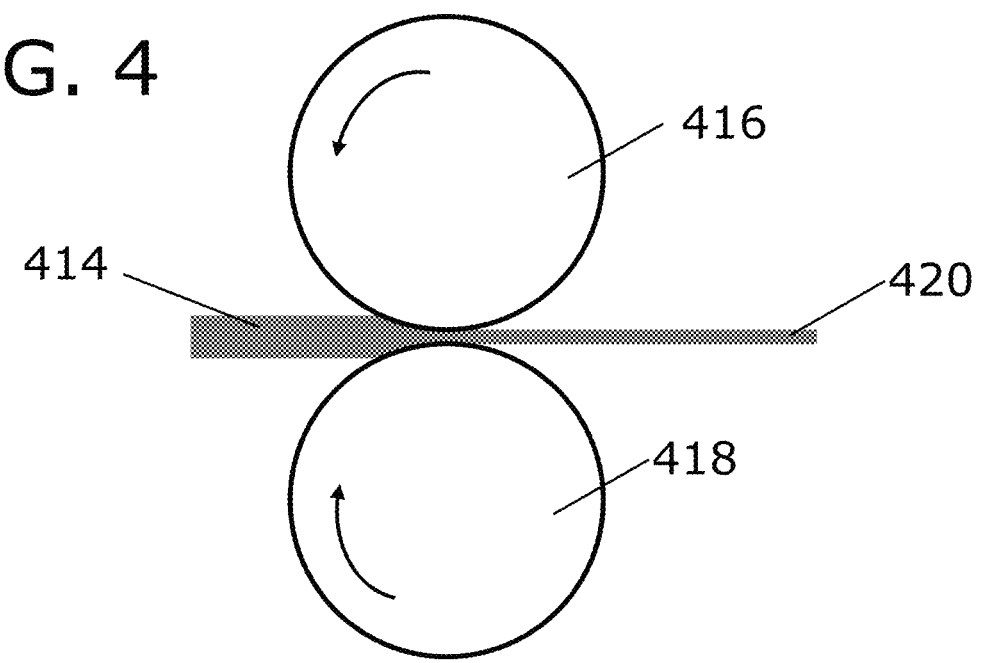
FIGS. 4-5 show a deformation step carried out during standard cold rolling.
Figure 5:
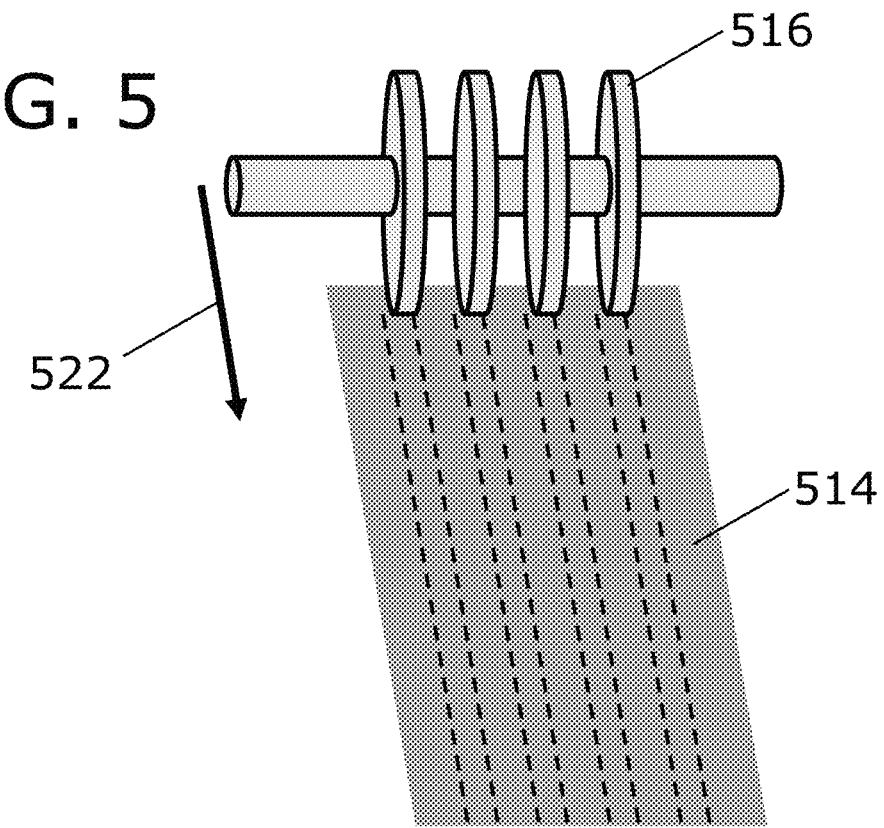

FIGS. 4-5 show a pressing step carried out during cold rolling.

FIG. 4 shows a relatively thick element 414 being treated via upper roll 416 and lower roll 418 so as to be transformed into a thinner element 420.

FIG. 5 shows a more specific embodiment of rolling, wherein the profiled roller 516 is shaped so as to enable pressing only selected portions of the element 514 when rolled in the direction 522, thereby forming a plurality of depressed strips.

Rolling Assisted Bi-axially Textured Substrates (RABiTS) will serve as an example for the technique.

Mechanical rolling is applied to a metal bar and rolled into a tape shape (cf., FIG. 4). Annealing is subsequently performed at high temperatures and a two-step annealing sequence is beneficial for texture formation. The RABiTS is then surface hardened, doped and/or oxidised in e.g. a gas furnace (cf., FIG. 3C) which may also act as the annealing treatment. Profiles (cf., FIG. 3D-E, and/or FIG. 5) are made by introducing an extra rolling step with a profiled roller (similar to the roller 516) in the end of tape production before/after an annealing heat treatment. An etching is performed using a reel-to-reel etching-bath system and following cleaned with distilled water/ethanol. Note that, RABiTS surface quality is (for some productions) optimised by electrochemical polishing.

FIG. 6 shows steps of a fabrication process for producing an elongated superconducting element.

Figure 6A:
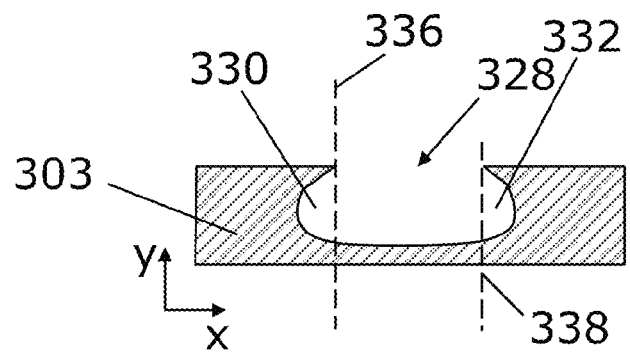
FIG. 6 shows steps of a fabrication process.

FIG. 6A shows a situation similar to the situation of FIG. 3H.

Figure 6B:
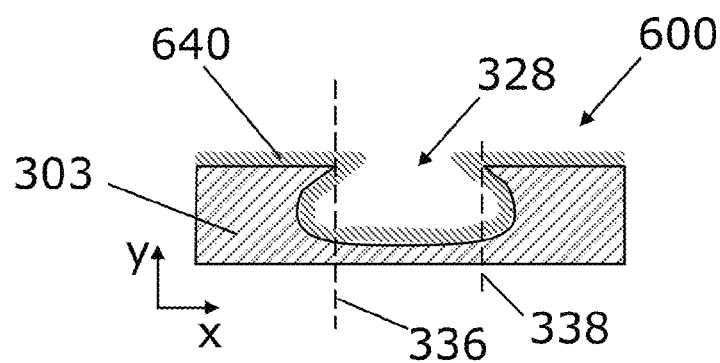

FIG. 6B shows placing, such as depositing, a layer of buffer material 640 on the lower layer 303 of the layered solid element. The lower layer 303 and the buffer material 640 form an exemplary substrate 600 suitable for supporting an elongated superconducting element.

A ceramic buffer layer stack (e.g. $Y_2O_3/YSZ/CeO_2$ for textured substrates) and superconducting layer (such as $YBa_2Cu_3O_7$) may be placed, such as deposited, such as deposited by pulsed laser deposition (PLD) using standard settings, on the lower layer 303 of the layered solid element.

Figure 6C:
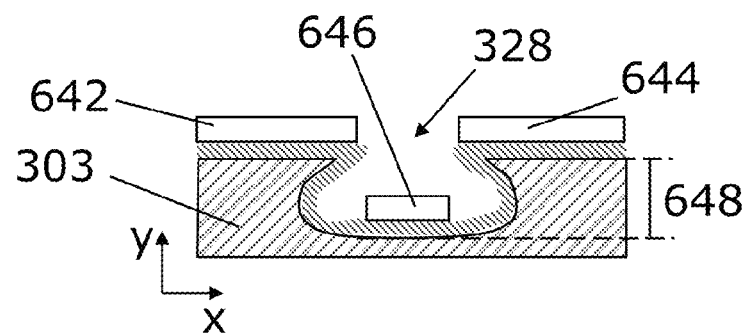

FIG. 6C shows placing a layer of superconducting material 642, 644, 646 on the buffer material, so that the undercut volumes serve to physically separate individual lines of superconducting material. It is understood that the distance 648 between bottom of the disruptive strips and the layer of material of the substrate is large enough so as to ensure that the separate portions 642, 644, 646 of layer of superconducting material on the buffer material is physically separated.

The deposition of ceramic buffer layers and superconducting layer (where at least one layer is deposited by a physical vapour technique/directional deposition) will only deposit material on the horizontal surfaces of the substrate. A complete strip decoupling is achieved via the undercut portions, and furthermore material usage is minimized.

Additional layers (silver/copper) added on top of the superconductor layer will also be decoupled.

The performance of the superconducting material with respect to critical current density ($J_c$), critical current ($I_c$), AC-losses (W) and frequency dependency ($f_d$) may be measured by vibrating sample measurements and transport measurements on small model samples (5×5 mm$^2$) at various applied fields and temperatures. A full scale, e.g., superconductor tape may be wound into a coil and tested at 77 K applying various magnetic fields and transport currents.

It is noted, that a possible advantage of embodiments of the invention may be, that a larger critical current ($I_c$) may be supported for a structure having a certain width. An explanation of this is that the total width of the separate portions 642, 644, 646 of layer of superconducting material is relatively large compared to prior art solutions where material between lines of superconducting material is made non-superconducting, cf., the embodiment shown in FIG. 2, where the total width of the striated superconductor (in FIG. 2(b)) is approximately half the width of the non-striated superconductor (in FIG. 2(a)). In comparison, with embodiments of the present invention, the total width of the striated superconductor may be more than 0.5, 0.6, 0.7, 0.8, 0.9 or 0.95 or 0.99 times the width of the non-striated superconductor, since the superconducting material may be placed both between and within disruptive strips.

Figure 7:
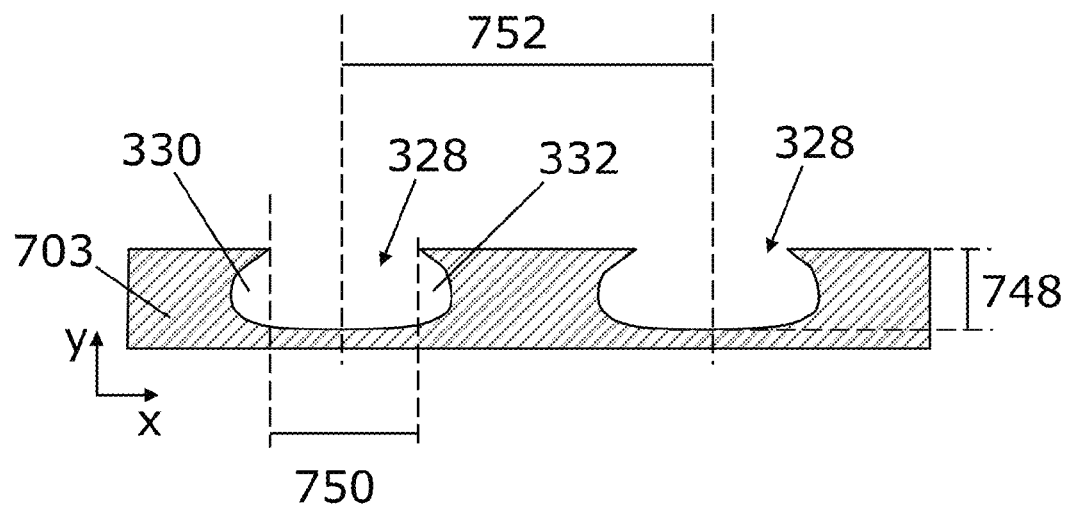
FIG. 7 illustrates dimensions of the disruptive strips.

FIG. 7 illustrates dimensions of the disruptive strips. The figure shows a situation similar to FIG. 3H or FIG. 6A, although the present figure show an additional disruptive strip 328 formed in the lower layer 703. Furthermore is indicated a distance 748 between a plane being parallel with an upper surface of the lower layer, and a plane being tangential to the bottom of the plurality of disruptive strips is within depth of the disruptive strips in the lower layer measured in the y-direction. Furthermore is indicated a width 750 of the disruptive strips in the lower layer measured in the x-direction, the width may in exemplary embodiments, be 1 micrometer, such as 2 micrometer, such as 5 micrometer, such as 10 micrometer, such as 30 micrometer, such as 100 micrometer, such as 1 mm, such as within 1 micrometer-1 mm. Furthermore is indicated a distance 752 between adjacent disruptive strips within the plurality of disruptive strips which is measured in the x-direction.

Figure 8:
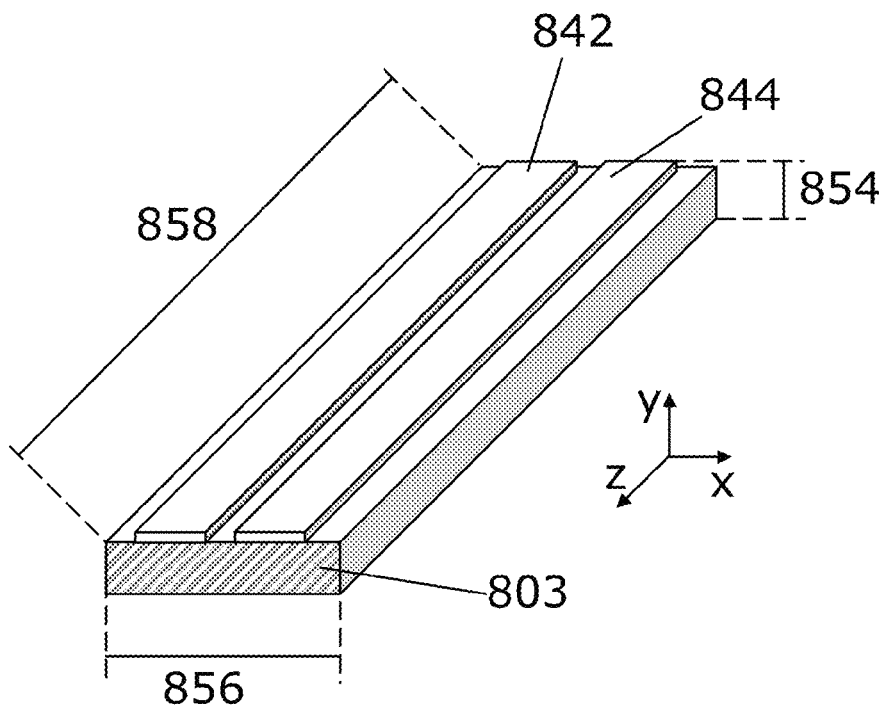
FIG. 8 illustrates dimensions of a superconducting structure.

FIG. 8 illustrates dimensions of a superconducting structure which has thickness 854 (length along a first dimension, which is in the y-axis) which is significantly smaller, such as 10, 100 or 1000 times smaller, than its width 856 (length along a second dimension, which is parallel to the x-axis) and where the width 856 is significantly smaller, such as 10, 100, or 1000 times smaller, than (length along a third dimension, which is parallel to the z-axis). The figure furthermore shows two layers 842, 844 of superconducting material on top of the lower layer 803. The thickness 854 may in exemplary embodiments be 10 micrometer, such as 20, such as 50 micrometer, such as 100 micrometer, such as 1 mm, such as within 10 micrometer-1 mm. The width 856 may in exemplary embodiments may in particular embodiments be 1 micrometer, such as 10 micrometer, such as 100 micrometer, such as 1 mm, such as 10 mm, such as 100 mm, such as 1 m, such as within 1 micrometer-1 m. The length 858 may in particular embodiments be 1 m, such as 10 m, such as 1 km, such as 20 km, such as 100 km, such as above 100 km, such as within 1 m-30 km, such as within 1 km-30 km.

EXAMPLES

Example A

'Coating-cut-etched'-tapes

A1. Providing the Upper Layer: Surface Layer/coating

The starting materials were commercially available Hastelloy C276 tapes, supplied annealed, and with a bright surface finish, from Stahlwerk Ergste Westig GmbH. The Hastealloy tape may be considered a primary solid element. Samples with typical dimensions; length ~100 mm, width ~10 mm and thickness ~0.1 mm, were cleaned in an ultrasonic bath using a mixture (10:1) of acetone and ethanol for 25 min, then dipped in ethanol, dried with compressed air. The samples were subsequently heat treated at 800-1000° C. for 3 h in an open tube furnace equipped with a fan in order to supply sufficient amounts of new air while growing a surface layer/coating (oxide/nitride). The surface layer may be considered the upper layer. A quartz-based holder enabled an upright positioning of the sample so that none of the tape sides, i.e., the two sides being parallel with a plane of the tape, were in contact with the sample holder.

It may be advantageous to avoid placing a tape with one side downwards, since this may typically result in an inhomogeneous, coarse and porous surface layer (oxide/nitride).

A2. Forming the Disruptive Strips: Cutting Disruptive Lines

A standard scalpel and plastic ruler were used to manually cut parallel disruptive lines, with a spacing of about 1 mm, into the surface layer of the oxide/nitride coated tapes. One, or more, cuts were typically performed until bright lines were clearly apparent during visual inspection. The bright lines indicate that exposed areas are formed. Shorter samples with a length of about 20 mm were cut from the tapes using a standard paper scissor.

The sample end, which was no longer coated with a surface layer due to the cutting, was protected using Kapton® films. About 1 mm was folded around the end onto the area with the disruptive lines and also applied firmly on the backside of the samples thus typically covering the sample backside as well.

A3. Etching the Exposed Areas so as to Form Undercuts: Undercut Etching

A glass container with 50 ml of 15% nitric acid ($HNO_3$) at 20° C. was stirred using a standard plastic coated magnetic stirrer. One stainless steel electrode with dimensions; length=50 mm, width=10 mm and thickness=2 mm, was placed in the glass container and connected to the negative output of the power supply. A sample was connected to the positive end of the power supply using an alligator clip that was positioned opposite to the end of the tape protection. The distance between the sample and the stainless steel electrode was about 20 mm. An ammeter was inserted between the power supply and the alligator clip. The sample was wriggled while firmly holding the clip to ensure sufficient electrical contact between the clip and the sample.

About 10 mm of the sample was immersed into the acid and a current, such as a current of 400 mA, 425 mA or 450 mA (with a voltage of about 2 V), was applied for 60 seconds. The sample was subsequently cleaned using three separate water baths, the cleaning comprising the steps of rinsing in each bath for about 2 minutes, and finally drying the sample using a paper tissue.

Silver Layer Deposition (Applies Only to Selected Samples in EXAMPLE A)

Samples for silver deposition were mounted either using adhesive carbon pads or a small metal holder. The sample produced using the method described in EXAMPLE A was coated with a silver layer using physical vapour deposition (E-beam evaporation, Alcatel machine). A 500 nm thick silver layer was produced at a deposition rate of ~7 Å/s and a pressure of ~6×10$^{-6}$ mbar.

Results

FIGS. 9-13 shows a sample provided according to the method of EXAMPLE A, where the profile was made by etching in 15% HNO3 applying 450 mA for 1 minute. No silver is deposited on the samples shown in FIGS. 9-13.

Figure 9:
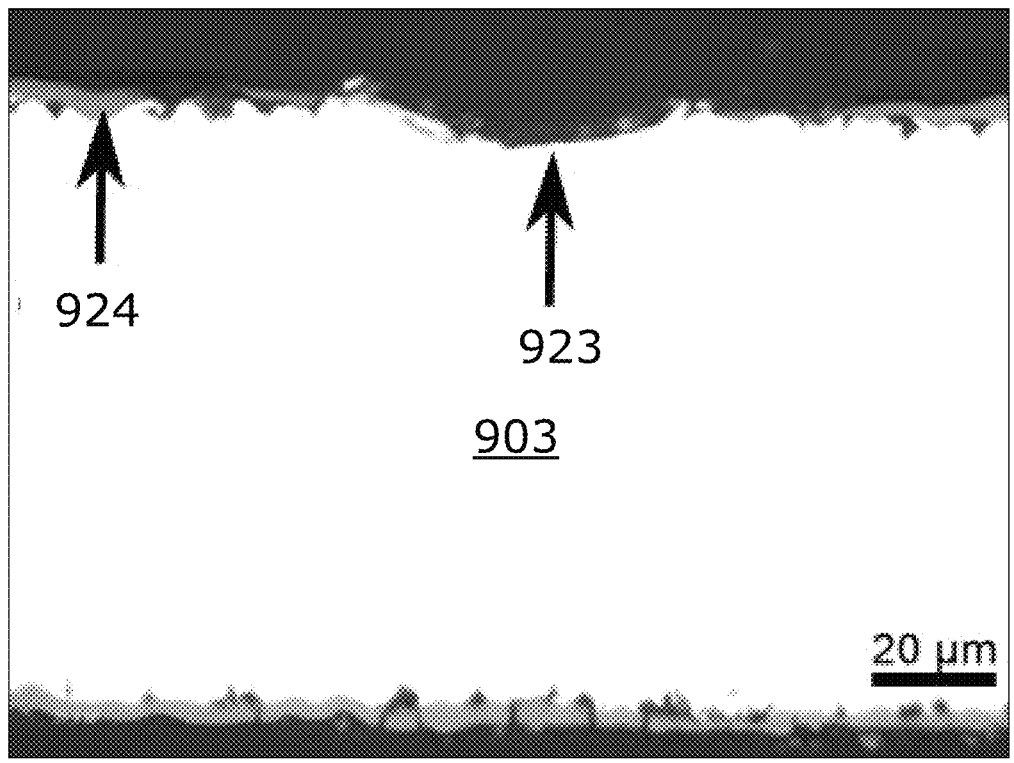
FIGS. 9-13 show a sample provided according to the method of EXAMPLE A.

FIG. 9 shows an optical microscopy image of the cross-section of a sample produced using the coating and cutting part from 'EXAMPLE A' (the viewing angle is similar to FIG. 3F). Notice that this sample has not been etched before the image is acquired. A clear opening in the upper layer 924 is present in the middle of the upper layer, i.e., upper surface layer (oxide layer) at the position where the cutting has been performed, so that an exposed area 923 is provided, i.e., an exposed area of the lower layer 903.

Figure 10:
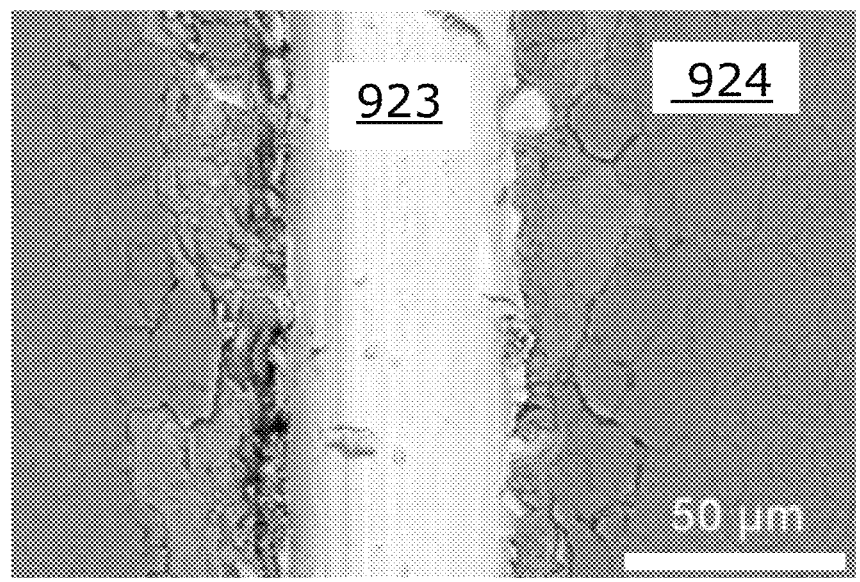

FIG. 10 is a scanning electron microscopy image of the top-view of a sample produced using the coating and cutting part from 'EXAMPLE A'. Notice that this sample has not been etched before the image is acquired. The upper layer, such as the surface layer (oxide layer) is deformed and the surface layer is removed and/or translated from the position where the cutting has been performed. The bright center strip is an opening into the Hastelloy metal tape.

Figure 11:
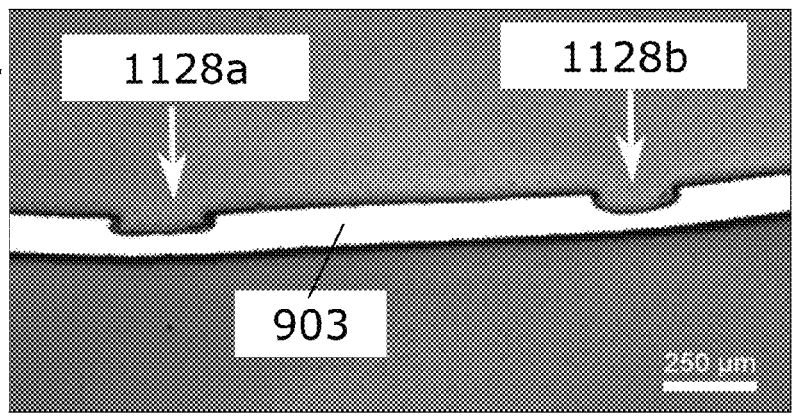
Figure 12:
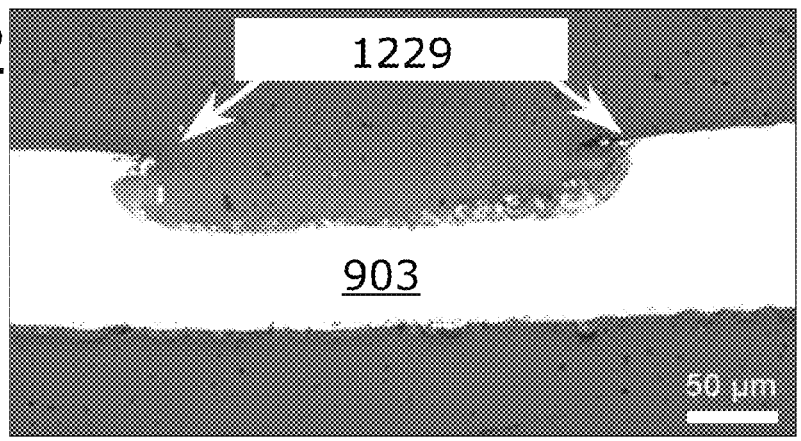
Figure 13:
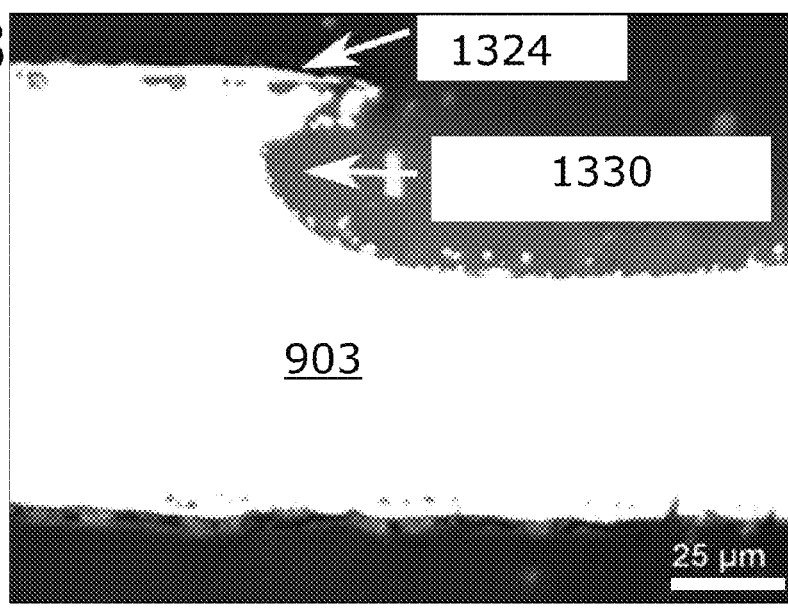

FIGS. 11-13 are optical microscopy images of the cross-section of a sample produced using 'Method A' (i.e., the viewing angle corresponds to FIG. 7). The profile was made by etching in 15% HNO3 applying 450 mA for 1 minute.

The undercut profiles are made in the Hastelloy metal tape and is not only a feature between the surface layer coating and the metal tape, i.e., the undercut volumes are below remaining portions of the lower layer.

FIG. 11 shows two undercut profiles, such as etched volumes 1128a, 1128b. The undercut profiles are made in the Hastelloy metal tape, i.e., lower layer 903.

FIG. 12 shows a zoom of the left etched volume 1128a from FIG. 11. The arrows indicate the undercut profile edges 1229.

FIG. 13 shows a zoom of the left etched volume 1128a from FIG. 12. The undercut volume 1330 is ~20 µm wide which is sufficient to physically separate a physical vapor deposited layer (this is demonstrated by the silver layer shown in FIG. 14. The figure also shows the remaining portion of the upper layer 1324.

Figure 14:
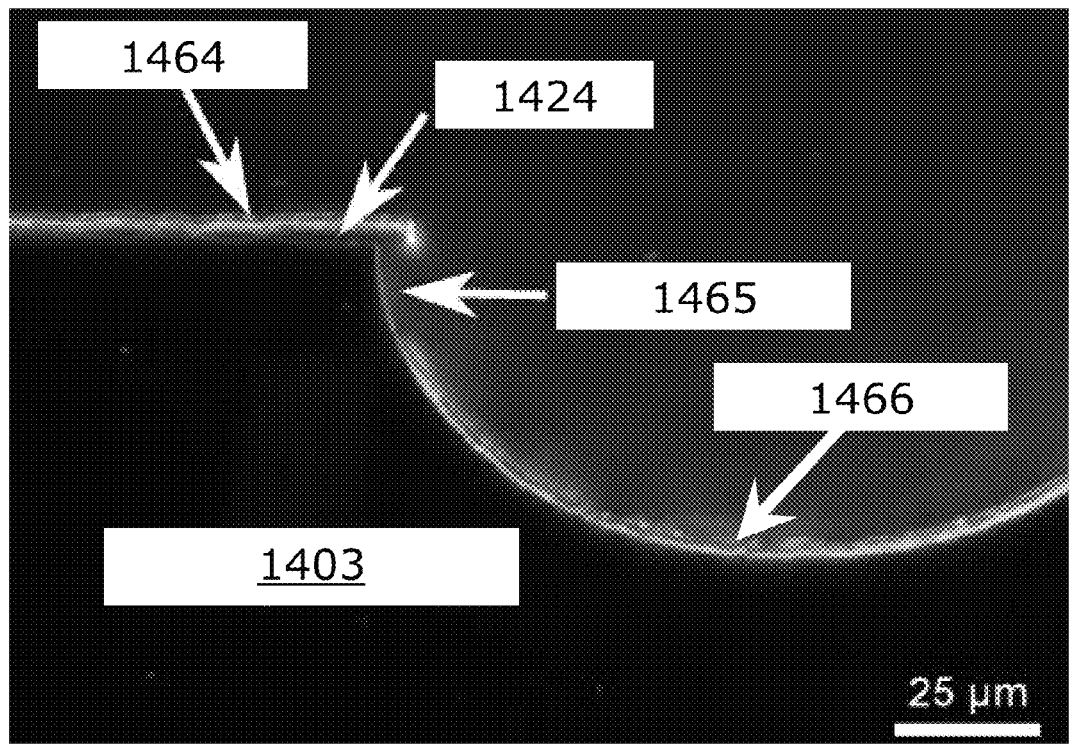
FIG. 14 shows an image of a sample produced using the method of EXAMPLE A.

FIG. 14 shows an optical microscopy image of the cross-section of a sample produced using 'EXAMPLE A', where the profile was made by etching in 15% HNO$_3$ applying 425 mA for 1 minute.

Furthermore, a 500 nm silver layer 1464, 1466 was deposited on the sample which was positioned horizontally above the silver source, i.e. the normal of the sample surface was parallel to the line-of-sight direction from the silver source.

The silver layer is physically separated as indicated in the gap 1465 at the left side of the profile due to the undercut feature between the lower layer 1403, being a Hastelloy metal tape and the upper layer 1424, being an oxide/nitride surface coating. Importantly, about 5 µm of the undercut feature (which in the present figure is given by the overhanging remaining portion of the upper layer 1424) is sufficient to produce a significant separation of the silver layer 1464 on top of the upper layer 1424 and the silver layer 1466 at the bottom of the etched volume.

Example B

'Coating-roll-etched'-tapes

B1. Surface Layer/coating

See section A1.

B2. Rolling/disruptive Lines

Figure 15:
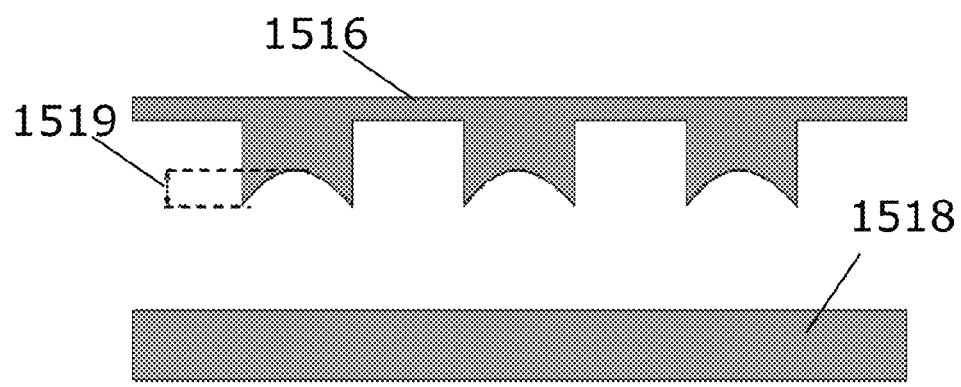
FIG. 15 is a schematic drawing showing an upper and lower roll.

A special set of profile-rolls were applied when producing disruptive lines in this method and a schematic drawing of the rolls is shown in FIG. 15.

FIG. 15 is a schematic drawing showing an upper roll 1516, being an upper profiled roller and a lower roller 1518. The height difference 1519 between the inner part of the curved part of the upper profiled roller and the edge of the curved part roll is 10 µm. Note that the drawing is not correctly scaled.

The coated tape was rolled manually without lubrication and at a low rolling speed as the rolls where driven using a set of Clyburn spanners (Swedish form). The PPR (per pass reduction) was approximately 1-20 micrometers. The speed of rolling was approximately 10 mm per second. Bright lines (indicating exposed areas) were apparent at the positions where the edge of the profiled roll had deformed the tape, and visible during subsequent inspection. The lines were accompanied by a stepwise profile perpendicular to the length of the tape.

B3. Undercut Etching

See section A3, except that this sample was etched for 120 seconds.

Results

Figure 16:
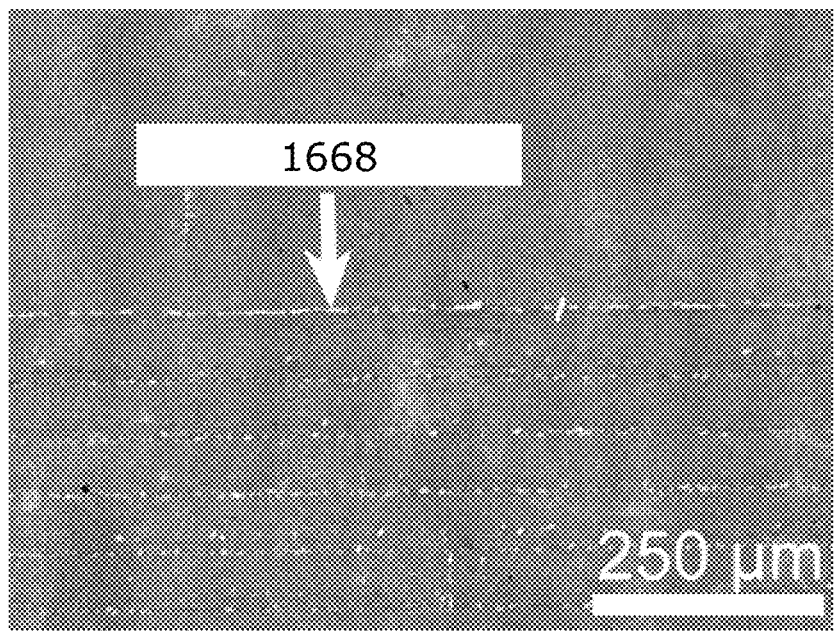
FIG. 16 shows an image of the top-view of a sample produced using the coating and rolling part from EXAMPLE B.

FIG. 16 shows a scanning electron microscopy image of the top-view of a sample produced using the coating and rolling part from 'EXAMPLE B'. The rolling lines, where the surface layer (oxide layer) has been disrupted, are clearly seen as bright stripes 1668. Multiple roll lines (bright lines) are seen in this image and are caused by the surface of individual profiles, i.e. each single curved profile part consist of many smaller tracks which is a result of the roll-fabrication process.

No roll profile was in contact with the upper part of the tape in the image and accordingly no stripes are observed here.

Figure 17:
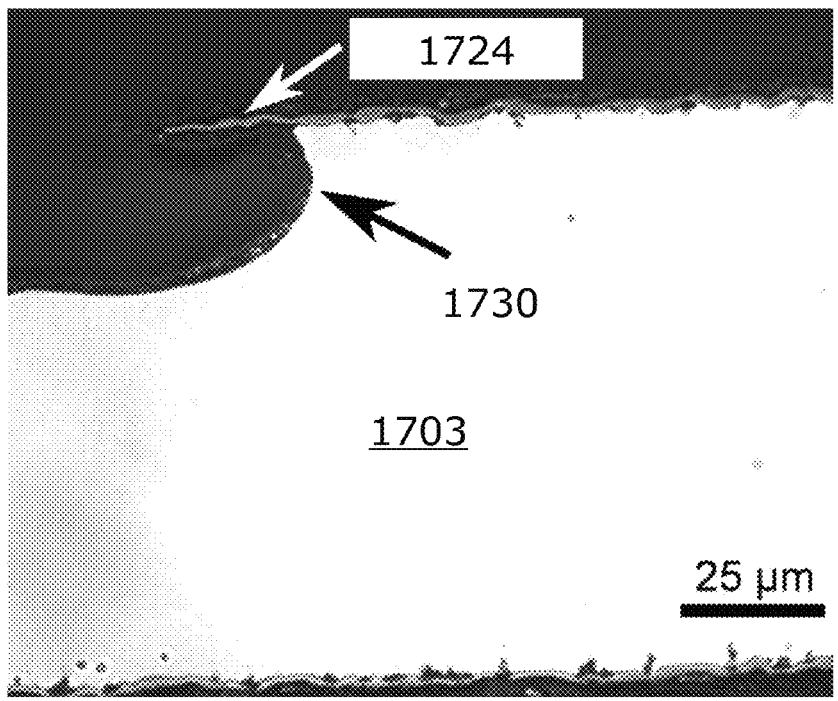
FIG. 17 is an image of a cross-section of a sample produced using EXAMPLE B.

FIG. 17 is an optical microscopy image of the cross-section of a sample produced using 'EXAMPLE B'. The profile was made by etching in 15% HNO3 applying 450 mA for 2 minute. An undercut profile, i.e., an undercut volume 1730 (indicated by the black arrow), is clearly present in the Hastelloy metal tape, i.e., the lower layer 1703. The undercut volume is below remaining portions of the lower layer. The oxide layer (surface layer) is not removed on this sample (see white arrow), i.e, the upper layer 1724.

Alternative Embodiments—Examples C, D, E, F.

In general, Kapton® film may be applied as an extra step for all fabrication methods, such as in order to minimize final polishing if it is placed on the areas where no profiles, such as disruptive strips or exposed areas, are present.

Example C

Roll-coating-cut/cut-roll-1

C1. Profile Rolling

The sample is rolled prior to coating using a profile roll similar to that shown in FIG. 15 (with/without the "cutting-edge" with depth 1519, such as 10 micrometer, of the roll).

C2. Forming the Upper Layer: Surface Layer/coating

A surface coating is prepared (see section A1 or using e.g. Kapton® film) after the initial (C1) rolling. This surface layer is covering the entire sample surface.

C3. Forming Disruptive Strips: Cutting/cut-rolling/grinding

Figure 18:
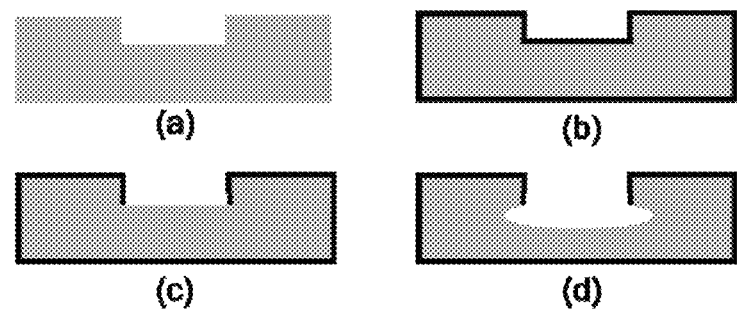
FIG. 18 shows a schematic drawing of the method described in EXAMPLE C.

A subsequent cutting or cut-rolling (roll with a sharp cutting-profile, see FIG. 15) is performed in the bottom of the profile, i.e. either removing only a small part of the horizontal part of the surface coating (i.e., the upper layer), in the bottom of the profile or the entire surface coating (i.e., the upper layer), in the bottom of the profile as shown in FIG. 18.

FIG. 18 shows a schematic drawing of the method described in Example C ('Roll-coat-cut' method). Subfigures a-d show: (a) Rolled sample, (b) after surface coating, (c) after cutting and (d) after etching.

While in the present EXAMPLE C the step of rolling (C1) precedes the step of cutting (C3), the opposite is also possible, i.e., a sequence of steps where cutting precedes rolling.

C4. Undercut-etching

See section A3.

Example D

Coat-roll-cut

Similar to EXAMPLE C but possibly without the initial profile rolling (C1), and with an additional cutting step is introduced after the rolling/cut-rolling to better open/break the surface layer at the positions where the undercut-profile is to be produced. This step is followed by the etching step, see section A3.

An advantage of EXAMPLE D is that in case the upper layer is not broken in the initial rolling/cut-rolling, then it may be broken in the additional cutting step.

While in the present EXAMPLE D the step of rolling/cut-rolling precedes the step of cutting, the opposite is also possible.

Example E

Coat-cut

An upper layer is provided by a protective layer, such as a standard photoresist for UV lithography, a Kapton® film or scotch tape.

The protective layer of e.g. photoresist (produced e.g. using die slot coating or dip coating) or Kapton® film, or scotch tape is applied to the sample surface (i.e., to a lower layer). Disruptive lines are made by cutting or roll-cutting lines into the protective layer and subsequently removing, e.g., every second of the thin strips of protective layer so that the sample surface is covered by parallel but separated e.g. Kapton® film areas. The sample is etched as in section A3.

Example F

Tape-etch-wax-etch

The starting material, such as the lower layer (e.g. Hastelloy tape), is coated with Kapton® film (or wax or lacquer) in stripes parallel to the length of the metal tape. The stripes should be e.g. 1 mm wide and positioned with a spacing of, e.g., 1 mm. Then the sample is etched (see section A3), cleaned and subsequently dried. Additional Kapton® film stripes (or wax or lacquer) are then positioned at the same positions as the first Kapton® film stripes but these stripes are e.g. 200 µm wider, i.e. second Kapton® film width=1.2 mm, as shown in FIG. 19.

Figure 19:
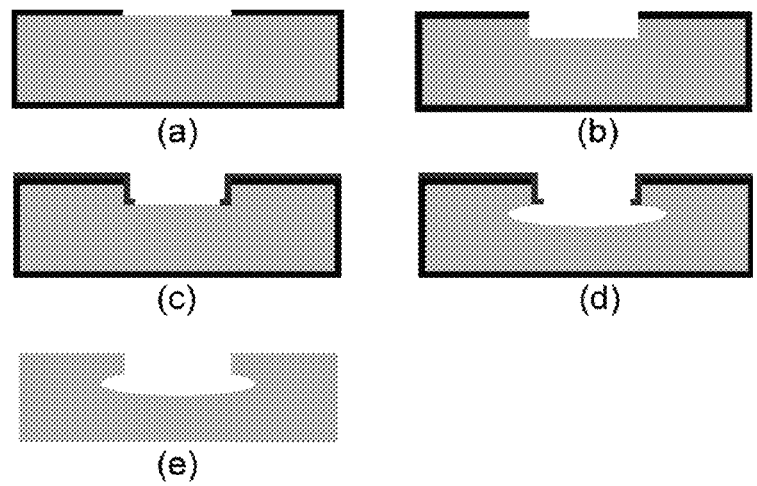
FIG. 19 shows a schematic drawing of the method described in Example F.

FIG. 19 shows a schematic drawing of the method described in Example F ('Tape-etch-wax-etch'). Subfigures a-e show: (a) sample coated in stripes, (b) after etching, (c) after additional coating, (d) after a second etching, (e) after removal of the coating.

Alternatively, the second coating (such as, cf., step (c) above), i.e., the second Kapton® film, wax or lacquer is applied only at the intersections between the Kapton® film and the metal tape. Notice that the Kapton® film may be firmly attached to the sample, e.g. using a brush or rubber rolls and then etched again (see section A3). An undercut profile is formed during the second etching process.

Additional Examples

The following examples comprises method steps which may be combined with one or more of the previous examples:

Example G

Method for Removing the Coating/oxide Layer

This method step is applicable, e.g., in combination with EXAMPLES comprising the method step described as A1, wherein the upper layer is formed as a surface coating being an oxide/nitride layer.

This surface coating was removed using a combination of a pulsed and alternating current while the sample was placed in the acid container and finally by using an ultrasonic ethanol/acetone/water bath.

More specifically, the sample was immersed about 10 mm into either 15% concentration of HCl, $HNO_3$ or buffered HF acid. The current level was set between 50 mA and 500 mA (with a voltage of 1-20 volt, such as ~2 volt) and the negative power output was connected to the sample while the positive output was connected to the stainless steel electrode positioned about 20 mm from the sample. Outputs were reversed after about 10 seconds of layer removal, so that the positive output was connected to the sample and the stainless steel electrode to the negative output. This procedure, flipping the current direction, was conducted until the sample was virtually free from the surface coating layer. Durations typically spanned from 30 seconds to 5 minutes. Residues were removed in the ultrasonic cleaning procedure (3 minutes duration in ethanol, acetone or water). Introducing a mechanical deformation, such as a rolling step, to the surface layer (i.e., the upper layer in cases where the upper layer is an oxide/nitride layer) could aid the coating-removal process.

Example H

Method for Electro-polishing

After removing the surface layer, i.e., the upper layer, additional electro-polishing may be required in order to obtain a smooth surface condition which may be particularly applicable for further deposition of e.g. buffer and/or superconducting layers. The electrolyte may for example be chosen from the group comprising $H_3PO_4$, HCl and $H_2SO_4$, or a similar electrolyte.

The skilled person will be capable of carrying out this procedure, and reference is made to a standard for this procedure and to the reference "*Electropolishing Stainless Steels*", by Alenka Kosmač, Euro Inox, Materials and Applications Series, Volume 11, ISBN: 978-2-87997-310-4, which is hereby incorporated by reference in entirety.

Example I

Undercut-profile Protection During Electro-polishing

Figure 20:
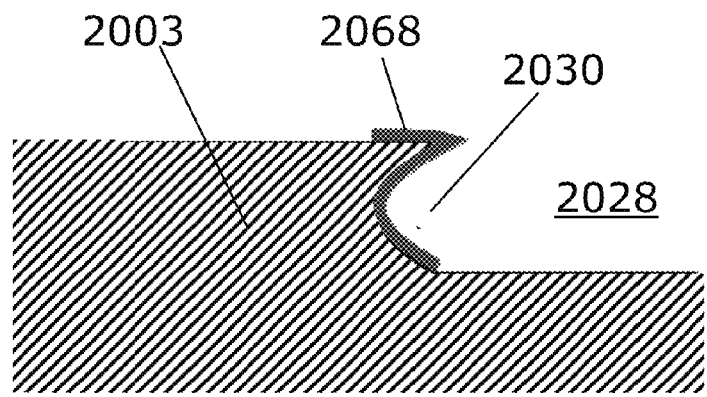
FIG. 20 is a schematic illustrating a method according to EXAMPLE I.

In order to ensure that significant electro-polishing of the sample surface, does not result in modified undercut-profiles, the following methods may be utilized:

Method of Protection—I.A:

Protective film with an adhesive side, such as Kapton® film, can be positioned at the profile edges so that it is only covering a small fraction of the area which shall be polished as shown in FIG. 20. The sample surface is thus covered with parallel thin protective films that may be firmly attached to the surface by e.g. applying a set of soft brushes on the tapes.

FIG. 20 is a schematic drawing showing a lower layer 2003 with an undercut volume as part of an etched volume 2028. The portion of the lower layer adjacent to the undercut volume is covered with a protective layer 2068, such Kapton® film, lacquer or wax.

Figure 21:
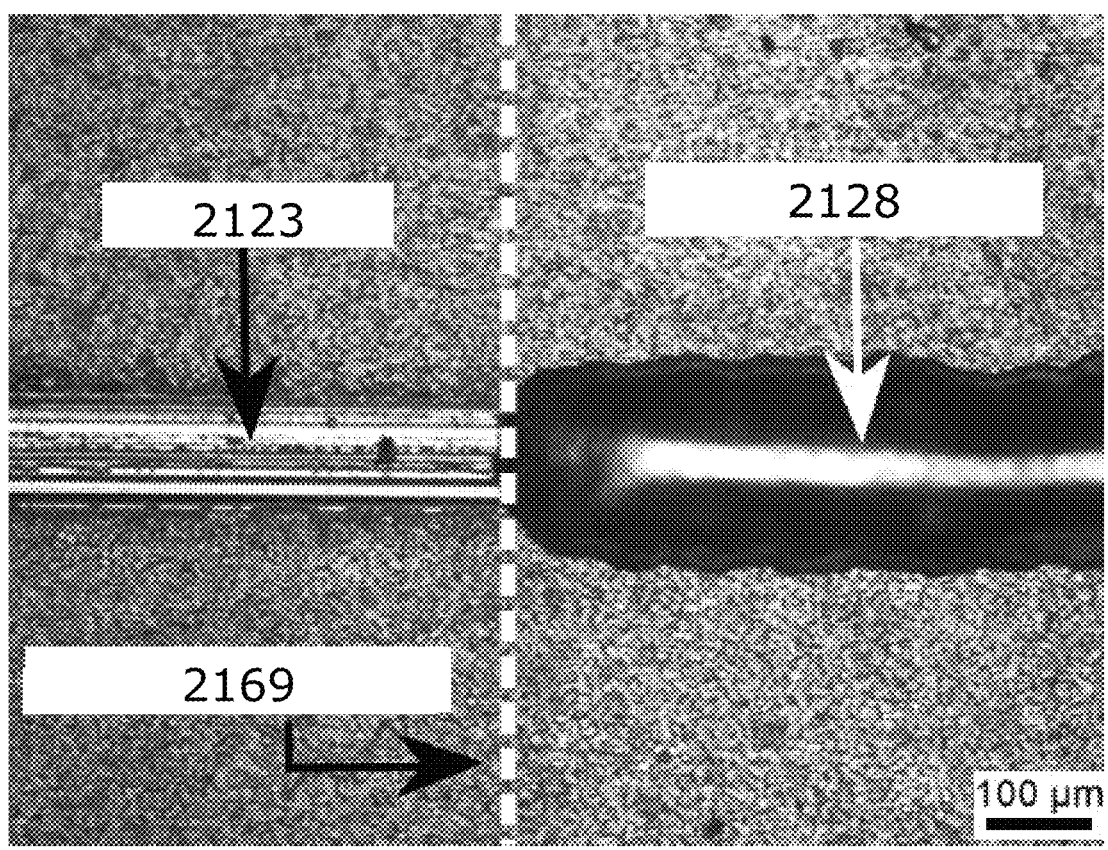
FIG. 21 shows an optical microscopy image of the top-view of a sample produced using 'EXAMPLE A', where a film is used for protection during etching.

FIG. 21 shows an optical microscopy image of the top-view of a sample produced using 'EXAMPLE A'. The profile was made by etching in 15% HNO3 applying 450 mA for 1 minute. The dashed line 2169 indicates the position of the protective Kapton® film during etching (the film was placed only on the left side of the dashed line). Notice that the Kapton® film was removed prior to the silver deposition. The left hand side of the image shows the cut-line, i.e., the exposed area 2123 without etching and with a silver layer. The right hand side shows the cut-line after etching, i.e., an etched area 2128, and with a silver layer. The figure shows that, e.g., Kapton® film, may serve to protect against etching.

Method of Protection—I.B:

Protective lacquer or wax may be coated in parallel lines using a slot die coater or an alternative standard coating process. This lacquer or wax can subsequently be removed using e.g. acetone or hot water.

Figure 22:
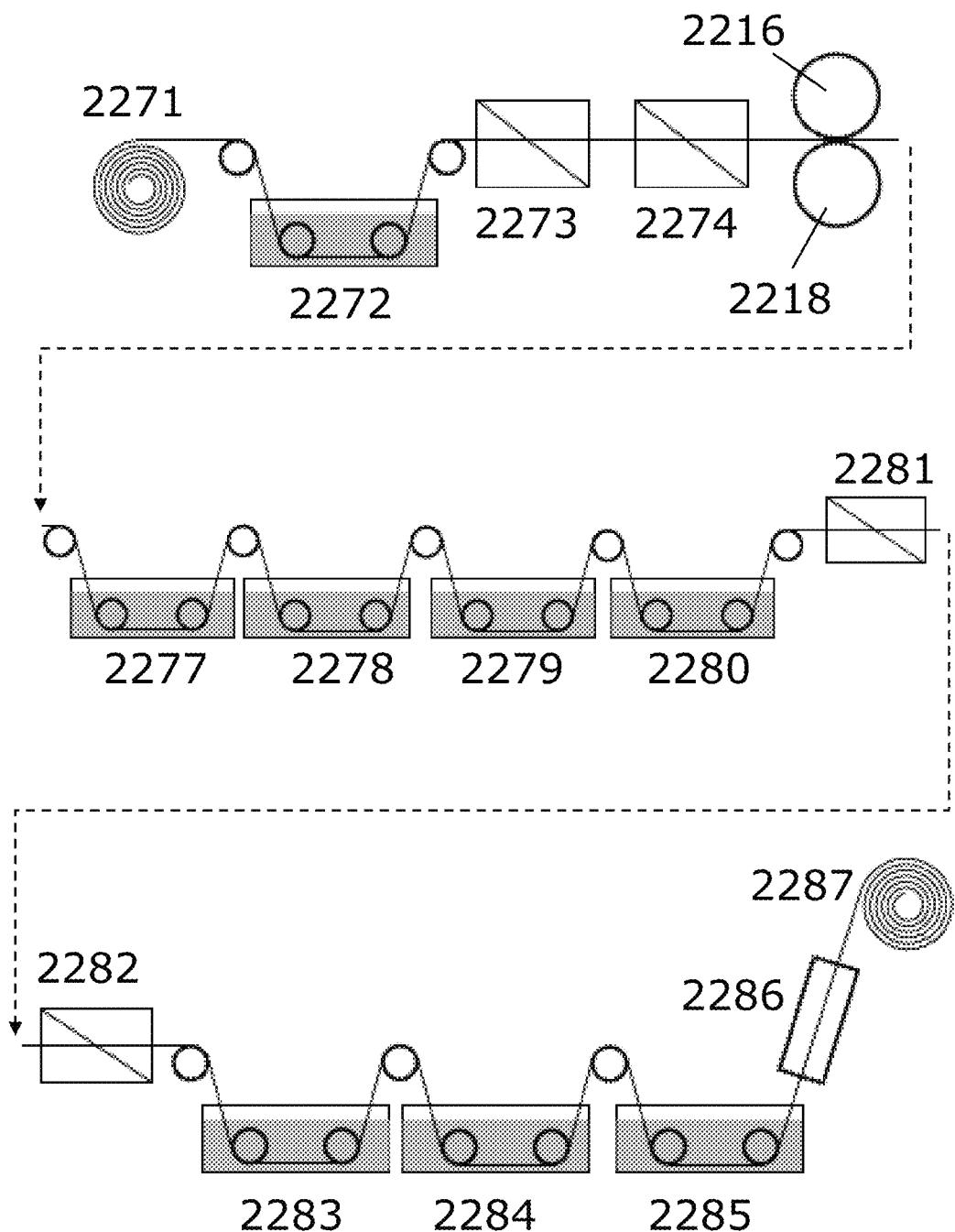
FIG. 22 shows an apparatus for carrying out the method according to the first aspect.

An apparatus for carrying out the method according to the first aspect:

FIG. 22 shows an apparatus for, such as arranged for, carrying out the method according to the first aspect. The figure shows a reel-to-reel system, where a metal tape is transferred from a first reel 2271 to a second reel 2287, and in the process is transformed into a substrate suitable for supporting an elongated superconducting element by going through an ultrasound cleaning bath 2272 comprising acetone and/or ethanol, a dryer 2273 using air or nitrogen ($N_2$), a heater 2274 using air and/or nitrogen ($N_2$) so as to form the upper layer as an oxide/nitride layer, a set of rolls comprising an upper roll 2216 and a lower roll 2218 (such as rolls similar to the rolls in FIG. 15) so as to form disruptive strips and exposed areas (note that the tape continues as indicated by the dashed line), an etching bath 2277 with $HNO_3$ where the tape is etched, a first cleaning bath 2278 with water, an oxide-removal bath 2279 which may employ ultrasound, such as ultrasound in HCl and/or ethanol, a second cleaning bath 2280 with water, a dryer 2281 using air or nitrogen ($N_2$) (note that the tape continues as indicated by the dashed line), a device 2282 for applying profile tape/wax/lacquer (as suggested in EXAMPLE I), an electrochemical polishing bath 2283 comprising $H_3PO_4$, a third cleaning bath 2284 with water, a third cleaning bath 2285 with water, a dryer 2286 using air or nitrogen ($N_2$), and finally the second reel 2287.

To sum up, there is provided a method for producing a substrate (600) suitable for supporting an elongated superconducting element, wherein, e.g., a deformation process is utilized in order to form disruptive strips in a layered solid element, and where etching is used to form undercut volumes (330, 332) between an upper layer (316) and a lower layer (303) of the layered solid element. Such relatively simple steps enable providing a substrate which may be turned into a superconducting structure, such as a superconducting tape, having reduced AC losses, since the undercut volumes (330, 332) may be useful for separating layers of material. In a further embodiment, there is placed a superconducting layer on top of the upper layer (316) and/or lower layer (303), so as to provide a superconducting structure with reduced AC losses.

In exemplary embodiments E1-E15, the invention may relate to:

E1. A method for producing a substrate suitable for supporting an elongated superconducting element, the method comprising the steps of:
  Providing a layered solid element, the layered solid element comprising
    a lower layer (303), and
    an upper layer (316),
    wherein the upper layer is placed adjacent the lower layer and at least partially covers the lower layer,
  Forming a plurality of disruptive strips in the upper layer (316) thereby forming a plurality of exposed areas (323) of the lower layer (303), where each exposed area is formed along a disruptive strip,
  Etching the exposed areas (323) so as to form undercut volumes (330, 332) between the upper layer (316) and the lower layer (303), where each undercut volume is formed along a disruptive strip, wherein an etchant is employed for which an etch rate for the lower layer (303) is higher than an etch rate for the upper layer (316).

E2. A method for producing a substrate suitable for supporting an elongated superconducting element wherein the step of
  forming a plurality of disruptive strips in the upper layer thereby forming a plurality of exposed areas of the lower layer, where each exposed area is formed along a disruptive strip,
  comprises a deformation process.

E3. A method for producing a substrate (600) suitable for supporting an elongated superconducting element according to any of the preceding embodiments, wherein the step of providing the layered solid element comprises
  a. Providing a primary solid element (202), the primary solid element having a primary upper layer (314) being substantially uniform,
  b. Forming the upper layer (316) of the layered solid element by any one of:
    i. Hardening an upper portion of the primary upper layer (314), such as hardening in a gas hardening process, ii. doping an upper portion of the primary upper layer (314), iii. preparation of an oxide or nitride layer within an upper portion of the primary upper layer.

E4. A method for producing a substrate (600) suitable for supporting an elongated superconducting element according to embodiment E2, wherein the step of forming in a deformation process a plurality of disruptive strips in the upper layer (316) comprises pressing a portion of the upper layer into the lower layer (303).

E5. A method for producing a substrate (600) suitable for supporting an elongated superconducting element according to any of the preceding embodiments, wherein a thickness (362) of the upper layer (316) of the layered solid element is within 1 nm-100 micrometer.

E6. A method for producing a substrate (600) suitable for supporting an elongated superconducting element according to any of the preceding embodiments, wherein a distance (752) between adjacent disruptive strips within the plurality of disruptive strips is within 1 micrometer-1 millimeter.

E7. A method for producing a substrate (600) suitable for supporting an elongated superconducting element according to any of the preceding embodiments, wherein a distance (748) between a plane being parallel with an upper surface of the lower layer (303) or an upper surface of the upper layer (326), and a plane being tangential to a bottom of the plurality of disruptive strips is large enough so as to enable that a superconducting material placed on the substrate will have portions in the disruptive strips and between the disruptive strips which are physically separated.

E8. A method for producing an elongated superconducting element, wherein the method further comprises placing a layer of superconducting material (642, 644, 646) on the upper layer (316) and/or lower layer (303) of the layered solid element according to any of the preceding embodiments so that the undercut volumes (330, 332) serve to physically separate individual lines of superconducting material.

E9. A method for producing an elongated superconducting element according to embodiment E8, wherein the method further comprises placing,
a. a layer of buffer material (640) on the upper layer (316) and/or lower layer (303) of the layered solid element according to any one of embodiments E1-E6, and
b. a layer of superconducting material (642, 644, 646) on the buffer material,
so that the undercut volumes (330, 332) serve to physically separate individual lines of superconducting material and/or buffer material.

E10. A method for producing an elongated superconducting element according to any one of embodiments E8-E9, wherein the step of placing a layer of superconducting material (642, 644, 646) and/or a layer of buffer material (640) is a line-of-sight process.

E11. A method for producing an elongated superconducting element according to any one of embodiments E8-E10, the method further comprising placing a shunt layer on the layer of superconducting material (642, 644, 646).

E12. A substrate suitable for supporting an elongated superconducting element, the substrate comprising:
a layered solid element, the layered solid element comprising
a lower layer (303),
lines of an upper layer (316),
wherein the lines of the upper layer (316) is placed adjacent the lower layer (303) and partially covers the lower layer,
wherein a plurality of disruptive strips between the lines of the upper layer (316) separates the lines of the upper layer (316),
and wherein undercut volumes (330, 332) are present between the lines of the upper layer (316) and the lower layer (303), where each undercut volume is formed along a disruptive strip.

E13. A substrate (600) suitable for supporting an elongated superconducting element according to embodiment E12, wherein the substrate is a tape.

E14. An elongated superconducting element comprising:
A substrate according to any one of embodiments E12-E13,
a superconducting layer placed, on the substrate so that the undercut volumes (330, 332) physically separates individual lines of superconducting material.

E15. Use of an elongated superconducting element according to embodiment E14, within any one of a performance magnetic coil, a transformer, a generator, a magnetic resonance scanner, a cryostat magnet, a large hadron collider, an AC power grid cable, a smart grid.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for producing a substrate suitable for supporting an elongated superconducting element, the method comprising the steps of:
providing a layered solid element, the layered solid element comprising
a lower layer, and
an upper layer,
wherein the upper layer is placed adjacent to the lower layer and at least partially covers the lower layer,
forming a plurality of disruptive strips in the upper layer thereby forming a plurality of exposed areas of the lower layer, where each exposed area is formed along a disruptive strip,
etching the exposed areas so as to form undercut volumes between the upper layer and the lower layer, where each undercut volume is formed along a disruptive strip, wherein an etchant is employed for which an etch rate for the lower layer is higher than an etch rate for the upper layer.

2. A method for producing a substrate suitable for supporting an elongated superconducting element according to claim 1, wherein the undercut volumes are below remaining portions of the lower layer.

3. A method for producing a substrate suitable for supporting an elongated superconducting element according to claim 1, wherein the step of forming a plurality of disruptive strips comprises a deformation process.

4. A method for producing a substrate suitable for supporting an elongated superconducting element according to claim 1, wherein the step of providing the layered solid element comprises
   a. providing a primary solid element, the primary solid element having a primary upper layer being substantially uniform,
   b. forming the upper layer of the layered solid element by any one of:
      i. Hardening an upper portion of the primary upper layer, such as hardening in a gas hardening process,
      ii. doping an upper portion of the primary upper layer,
      iii. preparing an oxide or nitride layer within an upper portion of the primary upper layer.

5. A method for producing a substrate suitable for supporting an elongated superconducting element according to claim 3, wherein the step of forming in a deformation process a plurality of disruptive strips in the upper layer comprises pressing a portion of the upper layer into the lower layer.

6. A method for producing a substrate suitable for supporting an elongated superconducting element according to claim 1, wherein a thickness of the upper layer of the layered solid element is within 1 nm-100 micrometer.

7. A method for producing a substrate suitable for supporting an elongated superconducting element according to claim 1, wherein a distance between adjacent disruptive strips within the plurality of disruptive strips is within 1 micrometer-1 millimeter.

8. A method for producing a substrate suitable for supporting an elongated superconducting element according to claim 1, wherein a distance between a plane being parallel with an upper surface of the lower layer or an upper surface of the upper layer, and a plane being tangential to a bottom of the plurality of disruptive strips is large enough so as to enable a superconducting material placed on the substrate to have portions in the disruptive strips and between the disruptive strips which are physically separated.

9. A method for producing an elongated superconducting element according to claim 1, wherein the method further comprises placing a layer of superconducting material on the upper layer and/or the lower layer of the layered solid element so that the undercut volumes serve to physically separate individual lines of superconducting material.

10. A method for producing an elongated superconducting element according to claim 1, wherein the method further comprises placing a layer of superconducting material on the upper layer and/or the lower layer of the layered solid element so that the undercut volumes serve to physically separate individual lines of superconducting material.

11. A method for producing an elongated superconducting element according to claim 9, wherein the method further comprises placing,
   a. a layer of buffer material on the upper layer and/or lower layer of the layered solid element, and
   b. a layer of superconducting material on the buffer material,
so that the undercut volumes serve to physically separate individual lines of superconducting material and/or buffer material.

12. A method for producing an elongated superconducting element according to claim 9, wherein the step of placing a layer of superconducting material and/or a layer of buffer material is a line-of-sight process.

13. A method for producing an elongated superconducting element according to claim 9, the method further comprising the step of placing a shunt layer on the layer of superconducting material.

14. A substrate suitable for supporting an elongated superconducting element, the substrate comprising:
   a layered solid element, the layered solid element comprising
      a lower layer,
      lines of an upper layer,
   wherein the lines of the upper layer are placed adjacent to the lower layer and partially covers the lower layer,
   wherein a plurality of disruptive strips between the lines of the upper layer separate the lines of the upper layer,
   wherein undercut volumes are present between the lines of the upper layer and the lower layer and each undercut volume is formed along a disruptive strip.

15. A substrate suitable for supporting an elongated superconducting element according to claim 14, wherein the substrate is a tape.

16. A substrate according to claim 14, further comprising
   a superconducting layer placed, on the substrate so that the undercut volumes physically separate individual lines of superconducting material.

17. A substrate according to claim 16, the substrate is part of a performance magnetic coil, a transformer, a generator, a magnetic resonance scanner, a cryostat magnet, a large hadron collider, an AC power grid cable, or a smart grid.

18. An apparatus for producing a substrate suitable for supporting an elongated superconducting element, the apparatus capable of:
   providing a layered solid element, the layered solid element comprising
      a lower layer, and
      an upper layer,
   wherein the upper layer is placed adjacent to the lower layer and at least partially covers the lower layer,
   forming a plurality of disruptive strips in the upper layer thereby forming a plurality of exposed areas of the lower layer, where each exposed area is formed along a disruptive strip, and
   etching the exposed areas so as to form undercut volumes between the upper layer and the lower layer, where each undercut volume is formed along a disruptive strip, wherein an etchant is employed for which an etch rate for the lower layer is higher than an etch rate for the upper layer.

* * * * *